US011088301B2

(12) United States Patent
Choi et al.

(10) Patent No.: US 11,088,301 B2
(45) Date of Patent: Aug. 10, 2021

(54) DISPLAY DEVICE USING SEMICONDUCTOR LIGHT-EMITTING ELEMENT

(71) Applicant: LG ELECTRONICS INC., Seoul (KR)

(72) Inventors: Hwanjoon Choi, Seoul (KR); Yonghan Lee, Seoul (KR)

(73) Assignee: LG ELECTRONICS INC., Seoul (KR)

(*) Notice: Subject to any disclaimer, the term of this patent is extended or adjusted under 35 U.S.C. 154(b) by 75 days.

(21) Appl. No.: 16/331,936

(22) PCT Filed: Nov. 16, 2016

(86) PCT No.: PCT/KR2016/013205
§ 371 (c)(1),
(2) Date: Mar. 8, 2019

(87) PCT Pub. No.: WO2018/048019
PCT Pub. Date: Mar. 15, 2018

(65) Prior Publication Data
US 2019/0245120 A1 Aug. 8, 2019

(30) Foreign Application Priority Data
Sep. 9, 2016 (KR) .................. 10-2016-0116670

(51) Int. Cl.
H01L 33/50 (2010.01)
H01L 25/075 (2006.01)
(Continued)

(52) U.S. Cl.
CPC ........ H01L 33/504 (2013.01); H01L 25/0753 (2013.01); H01L 33/00 (2013.01);
(Continued)

(58) Field of Classification Search
None
See application file for complete search history.

(56) References Cited

U.S. PATENT DOCUMENTS

2007/0257614 A1 11/2007 Kwon et al.
2009/0039375 A1* 2/2009 LeToquin .............. H01L 33/504
257/98
(Continued)

FOREIGN PATENT DOCUMENTS

CN 102041002 5/2011
CN 103222077 7/2013
(Continued)

OTHER PUBLICATIONS

European Patent Office Application Serial No. 16915814.4, Search Report dated Feb. 21, 2020, 9 pages.
(Continued)

Primary Examiner — Nicholas J Tobergte
Assistant Examiner — Kien C Ly
(74) Attorney, Agent, or Firm — Lee, Hong, Degerman, Kang & Waimey

(57) ABSTRACT

The present disclosure relates to a display device and, in particular, a display device using a semiconductor light-emitting device. The display device according to the present disclosure comprises: a substrate having a wiring electrode; a plurality of semiconductor light-emitting elements are electrically connected to the wiring electrode; a plurality of fluorescent substance layers for converting a wavelength of light; a wavelength conversion layer having a plurality of light-emitting elements formed from a plurality of fluorescent substance layers, and a color filter disposed so as to cover the wavelength conversion layer, where at least one of the plurality of fluorescent substance layers has a plurality of layers.

13 Claims, 16 Drawing Sheets

(51) Int. Cl.
*H01L 33/60* (2010.01)
*H05B 33/10* (2006.01)
*H05B 33/12* (2006.01)
*H01L 33/00* (2010.01)
*H01L 33/58* (2010.01)

(52) U.S. Cl.
CPC .............. *H01L 33/50* (2013.01); *H01L 33/58* (2013.01); *H01L 33/60* (2013.01); *H05B 33/10* (2013.01); *H05B 33/12* (2013.01); *H01L 2933/0041* (2013.01)

(56) References Cited

U.S. PATENT DOCUMENTS

| | | | |
|---|---|---|---|
| 2012/0288972 | A1* | 11/2012 | McKean .............. C09D 11/101 438/29 |
| 2014/0168572 | A1 | 6/2014 | Iwata et al. |
| 2015/0171372 | A1* | 6/2015 | Iwata ........................ C09D 7/41 257/40 |
| 2015/0255505 | A1* | 9/2015 | Jeoung .................. H05K 1/189 257/89 |
| 2016/0218142 | A1 | 7/2016 | Bang |

FOREIGN PATENT DOCUMENTS

| | | |
|---|---|---|
| CN | 103733243 | 4/2014 |
| CN | 104508822 | 4/2015 |
| CN | 105449074 | 3/2016 |
| EP | 2314658 | 4/2011 |
| KR | 20100067442 | 6/2010 |
| KR | 20120048218 | 5/2012 |
| KR | 20150108650 | 9/2015 |
| KR | 20150108650 A * | 9/2015 |
| KR | 20160068267 | 6/2016 |
| KR | 1020160068267 | 6/2016 |
| WO | 2010023840 | 3/2010 |

OTHER PUBLICATIONS

PCT International Application No. PCT/KR2016/013205, International Search Report dated May 23, 2017, 2 pages.
State Intellectual Property Office of the People's Republic of China Application Serial No. 201680089118.3, Office Action dated Jun. 28, 2020, 25 pages.
State Intellectual Property Office of the People's Republic of China Application Serial No. 201680089118.3, Office Action dated Feb. 20, 2021, 15 pages.

* cited by examiner

DISPLAY DEVICE USING SEMICONDUCTOR LIGHT-EMITTING ELEMENT

CROSS-REFERENCE TO RELATED APPLICATIONS

This application is the National Stage filing under 35 U.S.C. 371 of International Application No. PCT/KR2016/013205, filed on Nov. 16, 2016, which claims the benefit of earlier filing date and right of priority to Korean Application No. 10-2016-0116670, filed on Sep. 9, 2016, the contents of which are all hereby incorporated by reference herein in their entirety.

FIELD

The present disclosure relates to a display device, and more particularly, to a display device using a semiconductor light-emitting element.

BACKGROUND

In recent years, display devices having excellent characteristics such as low profile, flexibility and the like have been developed in the display technical field. On the contrary, currently commercialized main displays are represented by liquid crystal displays (LCDs) and active matrix organic light emitting diodes (AMOLEDs). However, there exist problems such as not-so-fast response time, difficult implementation of flexibility in case of LCDs, and there exist drawbacks such as short life span, not-so-good yield as well as low flexibility in case of AMOLEDs.

On the other hand, light emitting diodes (LEDs) are well known light-emitting elements for converting an electrical current to light, and have been used as a light source for displaying an image in an electronic device including information communication devices since red LEDs using GaAsP compound semiconductors were made commercially available in 1962, together with a GaP:N-based green LEDs. Accordingly, the semiconductor light-emitting elements may be used to implement a flexible display, thereby presenting a scheme for solving the problems.

A structure in which light emitted from the semiconductor light-emitting element is excited with yellow light using a wavelength conversion layer and filtered with a wavelength of red or green using a color filter may be applicable to a flexible display using the semiconductor light-emitting element. In such a structure, a peak wavelength of yellow phosphor is 500 to 600 nanometers, and accordingly, a problem occurs in that the luminance of red having a wavelength of greater than 600 nanometers is reduced. Therefore, the present disclosure proposes a mechanism for solving such a problem.

SUMMARY

An object of the present disclosure is to provide a display device capable of improving the luminance of red in a display device.

Another object of the present disclosure is to provide a mechanism capable of improving the display efficiency and color purity of a display while securing the structural reliability of a wavelength conversion layer.

Still another object of the present disclosure is to provide a mechanism capable of improving a structure in which inorganic phosphor shrinks due to the evaporation of solvent.

A display device according to the present disclosure may form a phosphor layer with a plurality of layers on a red pixel to compensate for the luminance of red.

For a specific example, the display device may include a substrate on which wiring electrodes are formed, a plurality of semiconductor light-emitting elements electrically connected to the wiring electrodes, a wavelength conversion layer provided with a plurality of phosphor layers that convert a wavelength of light and a plurality of partition wall portions formed between the plurality of semiconductor light-emitting elements to cover the plurality of semiconductor light-emitting elements, and a color filter disposed to cover the wavelength conversion layer, wherein at least one of the plurality of phosphor layers includes a plurality of layers.

According to an embodiment, the plurality of layers may be formed to allow red phosphor to overlap with yellow or green phosphor.

According to an embodiment, the plurality of phosphor layers may include a first phosphor layer and a second phosphor layer, and the first phosphor layer may include the plurality of layers, and phosphor provided in the second phosphor layer may be the yellow phosphor. The second phosphor layer may be formed with a single layer including the yellow phosphor. The yellow phosphor may include at least one of YAG and LuAG.

According to an embodiment, the red phosphor may be mixed with a photosensitive material to form any one of the plurality of layers.

The red phosphor may form a first layer including inorganic phosphor, and a height of the first layer may be within a range of 50% to 90% of a height of the partition wall portion. A second layer including the yellow phosphor may be formed on the first layer.

According to an embodiment, the red phosphor may form a first layer including organic phosphor, and a second layer including the yellow phosphor may be formed below the first layer. The second layer may be formed of the same material and with the same height as a phosphor layer disposed on a green pixel. A thickness of the first layer may be within a range of 0.1 to 3 micrometers.

In addition, the present disclosure discloses a method of fabricating a display device, and the method may include coupling a plurality of semiconductor light-emitting elements to a substrate, forming a wavelength conversion layer disposed to cover the plurality of semiconductor light-emitting elements, and placing a color filter to cover the wavelength conversion layer using an adhesive layer, wherein the wavelength conversion layer includes a first phosphor layer and a second phosphor layer that convert a wavelength of light, and the first phosphor layer includes a plurality of layers.

A first layer of the plurality of layers may include red phosphor formed by a photolithography method, and a second layer thereof may include yellow or green phosphor formed by a coating method.

In the display device according to the present disclosure, yellow phosphor may be used for a green pixel, and yellow phosphor and red phosphor may be used for a red pixel, thereby allowing color coordinates adjustment using a phosphor suitable for each pixel.

In contrast to a structure in the related art, the luminance of a red pixel to a wavelength of greater than 600 nm may be increased to increase the luminance of red, thereby improving color purity.

Furthermore, the structure of part of the wavelength conversion layer may be changed, thereby improving display efficiency and color purity while securing structural reliability.

In addition, according to the present disclosure, it may be possible to easily solve the problem that shrinkage occurs due to solvent evaporation subsequent to patterning inorganic phosphor to cause a step between the color filter and the phosphor region.

BRIEF DESCRIPTION OF THE DRAWINGS

The embodiments will be described in detail with reference to the following drawings in which like reference numerals refer to like elements wherein.

DETAILED DESCRIPTION

Figure 1:
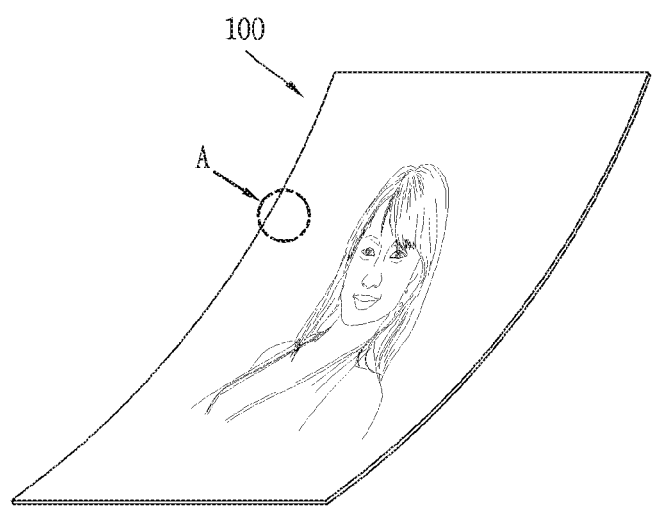
FIG. 1 is a conceptual view illustrating a display device using a semiconductor light-emitting element according to an embodiment of the present disclosure.

Hereinafter, the embodiments disclosed herein will be described in detail with reference to the accompanying drawings, and the same or similar elements are designated with the same numeral references regardless of the numerals in the drawings and their redundant description will be omitted. A suffix "module" and "unit" used for constituent elements disclosed in the following description is merely intended for easy description of the specification, and the suffix itself does not give any special meaning or function. In describing the present disclosure, if a detailed explanation for a related known function or construction is considered to unnecessarily divert the gist of the present disclosure, such explanation has been omitted but would be understood by those skilled in the art. Also, it should be noted that the accompanying drawings are merely illustrated to easily explain the concept of the invention, and therefore, they should not be construed to limit the technological concept disclosed herein by the accompanying drawings.

Furthermore, it will be understood that when an element such as a layer, region or substrate is referred to as being "on" another element, it can be directly on the another element or an intermediate element may also be interposed therebetween.

A display device disclosed herein may include a portable phone, a smart phone, a laptop computer, a digital broadcast terminal, a personal digital assistant (PDA), a portable multimedia player (PMP), a navigation, a slate PC, a tablet PC, an ultrabook, a digital TV, a desktop computer, and the like. However, it would be easily understood by those skilled in the art that a configuration disclosed herein may be applicable to any displayable device even though it is a new product type which will be developed later.

FIG. 1 is a conceptual view illustrating a display device using a semiconductor light-emitting element according to an embodiment of the present disclosure.

According to the drawing, information processed in the controller of the display device 100 may be displayed using a flexible display.

The flexible display may include a flexible, bendable, twistable, foldable and rollable display. For example, the flexible display may be a display fabricated on a thin and flexible substrate that can be warped, bent, folded or rolled like a paper sheet while maintaining the display characteristics of a flat display in the related art.

A display area of the flexible display becomes a plane in a configuration that the flexible display is not warped (for example, a configuration having an infinite radius of curvature, hereinafter, referred to as a "first configuration"). The display area thereof becomes a curved surface in a configuration that the flexible display is warped by an external force in the first configuration (for example, a configuration having a finite radius of curvature, hereinafter, referred to as a "second configuration"). As illustrated in the drawing, information displayed in the second configuration may be visual information displayed on a curved surface. The visual information may be realized in such a manner that a light emission of each unit pixel (sub-pixel) arranged in a matrix configuration is controlled independently. The unit pixel denotes an elementary unit for representing one color.

The sub-pixel of the flexible display may be implemented by a semiconductor light-emitting element. According to the present disclosure, a light emitting diode (LED) is illustrated as a type of semiconductor light-emitting element. The light emitting diode may be formed with a small size to perform the role of a sub-pixel even in the second configuration through this.

Hereinafter, a flexible display implemented using the light emitting diode will be described in more detail with reference to the accompanying drawings.

Figure 2:
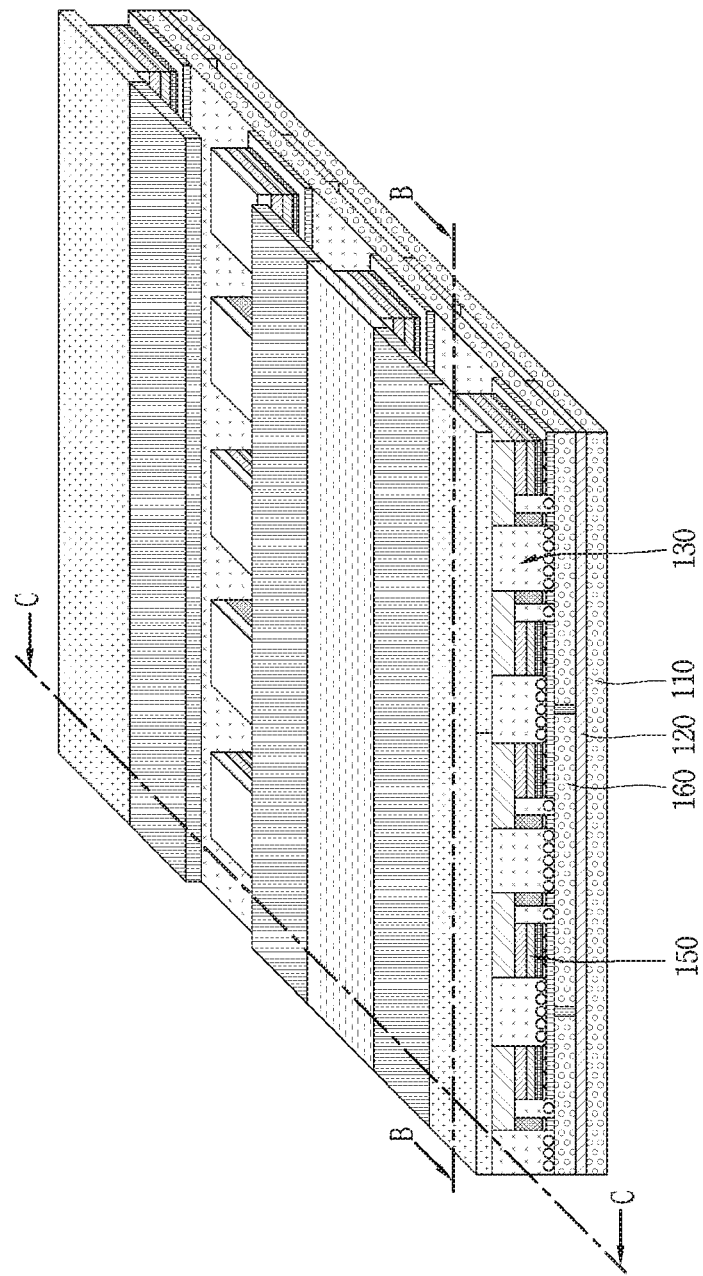
FIG. 2 is a partial enlarged view of portion "A" in FIG. 1, and FIGS. 3A and 3B are cross-sectional views taken along lines B-B and C-C in FIG. 2.
Figure 3A:
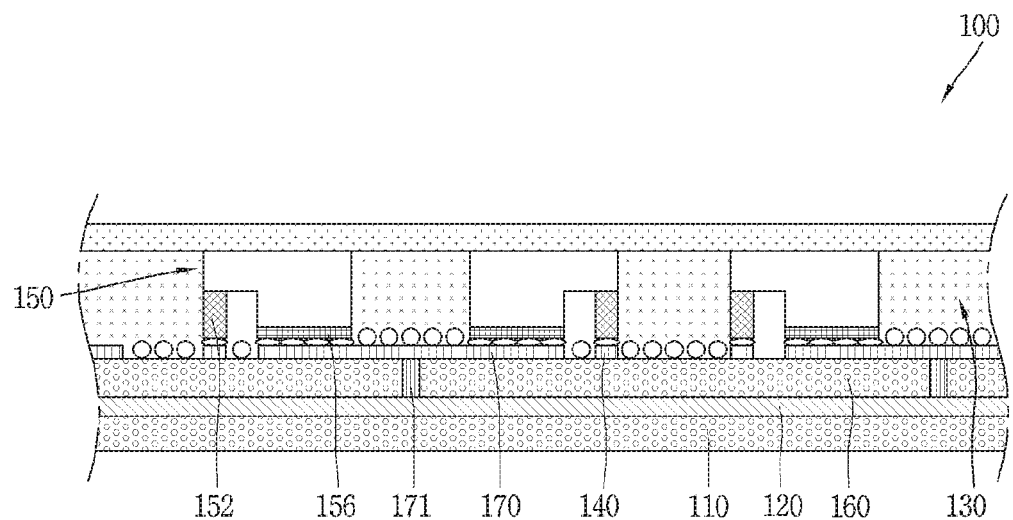
Figure 3B:
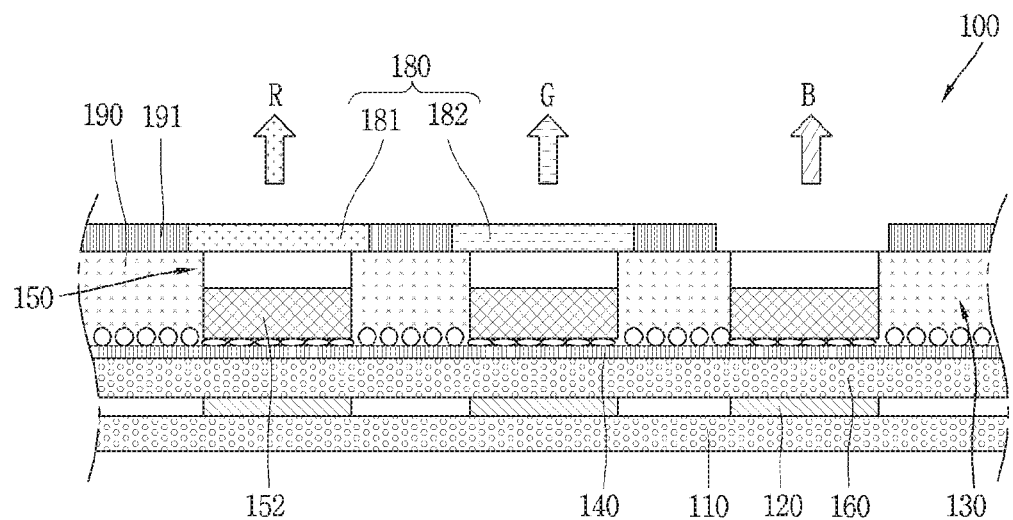
Figure 4:
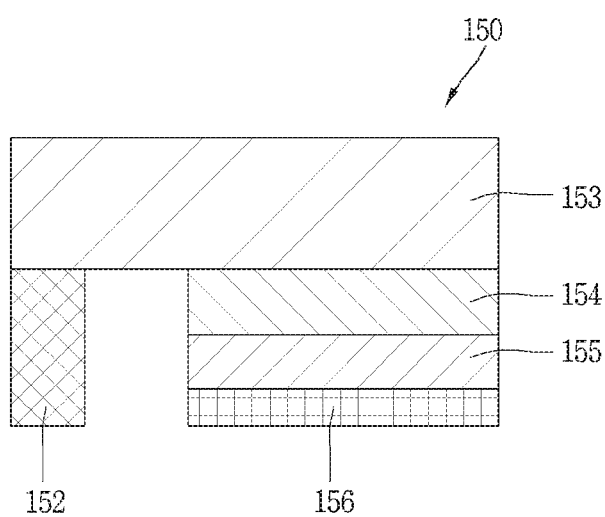
FIG. 4 is a conceptual view illustrating a flip chip type semiconductor light-emitting element in FIG. 3.

FIG. 2 is a partial enlarged view of portion "A" in FIG. 1, and FIGS. 3A and 3B are cross-sectional views taken along lines B-B and C-C in FIG. 2, FIG. 4 is a conceptual view illustrating a flip-chip type semiconductor light-emitting element in FIG. 3A, and FIGS. 5A through 5C are conceptual views illustrating various forms for implementing colors in connection with a flip-chip type semiconductor light-emitting element.

According to the drawings in FIGS. 2, 3A and 3B, there is illustrated a display device 100 using a passive matrix (PM) type semiconductor light-emitting element as a display device 100 using a semiconductor light-emitting element. However, an example described below may also be applicable to an active matrix (AM) type semiconductor light-emitting element.

The display device 100 may include a substrate 110, a first electrode 120, a conductive adhesive layer 130, a second electrode 140, and a plurality of semiconductor light-emitting elements 150.

The substrate 110 may be a flexible substrate. The substrate 110 may contain glass or polyimide (PI) to implement the flexible display device. In addition, if it is a flexible material, any one such as polyethylene naphthalate (PEN), polyethylene terephthalate (PET) or the like may be used. Furthermore, the substrate 110 may be either one of transparent and non-transparent materials.

The substrate 110 may be a wiring substrate disposed with the first electrode 120, and thus the first electrode 120 may be placed on the substrate 110.

According to the drawing, an insulating layer 160 may be disposed on the substrate 110 placed with the first electrode 120, and an auxiliary electrode 170 may be placed on the insulating layer 160. In this case, a configuration in which the insulating layer 160 is deposited on the substrate 110 may be single wiring substrate. More specifically, the insulating layer 160 may be incorporated into the substrate 110 with an insulating and flexible material such as polyimide (PI), PET, PEN or the like to form single wiring substrate.

The auxiliary electrode 170 as an electrode for electrically connecting the first electrode 120 to the semiconductor light-emitting element 150 is placed on the insulating layer 160, and disposed to correspond to the location of the first electrode 120. For example, the auxiliary electrode 170 has a dot shape, and may be electrically connected to the first electrode 120 by means of an electrode hole 171 passing through the insulating layer 160. The electrode hole 171 may be formed by filling a conductive material in a via hole.

Referring to the drawings, the conductive adhesive layer 130 may be formed on one surface of the insulating layer 160, but the present disclosure may not be necessarily limited to this. For example, it may be possible to also have a structure in which the conductive adhesive layer 130 is disposed on the substrate 110 with no insulating layer 160. The conductive adhesive layer 130 may perform the role of an insulating layer in the structure in which the conductive adhesive layer 130 is disposed on the substrate 110.

The conductive adhesive layer 130 may be a layer having adhesiveness and conductivity, and to this end, a conductive material and an adhesive material may be mixed on the conductive adhesive layer 130. Furthermore, the conductive adhesive layer 130 may have flexibility, thereby allowing a flexible function in the display device.

For such an example, the conductive adhesive layer 130 may be an anisotropic conductive film (ACF), an anisotropic conductive paste, a solution containing conductive particles, and the like. The conductive adhesive layer 130 may allow electrical interconnection in the z-direction passing through the thickness thereof, but may be configured as a layer having electrical insulation in the horizontal x-y direction thereof. Accordingly, the conductive adhesive layer 130 may be referred to as a z-axis conductive layer (however, hereinafter referred to as a "conductive adhesive layer").

The anisotropic conductive film is a film with a form in which an anisotropic conductive medium is mixed with an insulating base member, and thus when heat and pressure are applied thereto, only a specific portion thereof may have conductivity by means of the anisotropic conductive medium. Hereinafter, heat and pressure are applied to the anisotropic conductive film, but other methods may be also available for the anisotropic conductive film to partially have conductivity. The methods may include applying only either one of heat and pressure thereto, UV curing, and the like.

Furthermore, the anisotropic conductive medium may be conductive balls or particles. According to the drawing, in this example, the anisotropic conductive film is a film with a form in which an anisotropic conductive medium is mixed with an insulating base member, and thus when heat and pressure are applied thereto, only a specific portion thereof may have conductivity by means of the conductive balls. The anisotropic conductive film may be in a state in which a core with a conductive material contains a plurality of particles coated by an insulating layer with a polymer material, and in this case, it may have conductivity by means of the core while breaking an insulating layer on a portion to which heat and pressure are applied. Here, a core may be transformed to implement a layer having both surfaces to which objects contact in the thickness direction of the film. For a more specific example, heat and pressure are applied to an anisotropic conductive film as a whole, and electrical connection in the z-axis direction is partially formed by a height difference from a mating object adhered by the use of the anisotropic conductive film.

For another example, an anisotropic conductive film may be in a state containing a plurality of particles in which a conductive material is coated on insulating cores. In this case, a portion to which heat and pressure are applied may be converted (pressed and adhered) to a conductive material to have conductivity in the thickness direction of the film. For still another example, it may be formed to have conductivity in the thickness direction of the film in which a conductive material passes through an insulating base member in the z-direction. In this case, the conductive material may have a pointed end portion.

According to the drawing, the anisotropic conductive film may be a fixed array anisotropic conductive film (ACF) configured with a form in which conductive balls are inserted into one surface of the insulating base member. More specifically, the insulating base member is formed of an adhesive material, and the conductive balls are intensively disposed at a bottom portion of the insulating base member, and when heat and pressure are applied thereto, the base member is modified along with the conductive balls, thereby having conductivity in the vertical direction thereof.

However, the present disclosure may not be necessarily limited to this, and the anisotropic conductive film may be all allowed to have a form in which conductive balls are randomly mixed with an insulating base member or a form configured with a plurality of layers in which conductive balls are disposed at any one layer (double-ACF), and the like.

The anisotropic conductive paste as a form coupled to a paste and conductive balls may be a paste in which conductive balls are mixed with an insulating and adhesive base material. Furthermore, a solution containing conductive particles may be a solution in a form containing conductive particles or nano particles.

Referring again to the drawing, the second electrode 140 is located at the insulating layer 160 to be separated from the auxiliary electrode 170. In other words, the conductive adhesive layer 130 is disposed on the insulating layer 160 located with the auxiliary electrode 170 and second electrode 140.

When the conductive adhesive layer 130 is formed in a state that the auxiliary electrode 170 and second electrode 140 are located, and then the semiconductor light-emitting element 150 is connect thereto in a flip chip form with the application of heat and pressure, the semiconductor light-emitting element 150 is electrically connected to the first electrode 120 and second electrode 140.

Referring to FIG. 4, the semiconductor light-emitting element may be a flip chip type semiconductor light-emitting element.

For example, the semiconductor light-emitting element may include a p-type electrode 156, a p-type semiconductor layer 155 formed with the p-type electrode 156, an active layer 154 formed on the p-type semiconductor layer 155, an n-type semiconductor layer 153 formed on the active layer 154, and an n-type electrode 152 disposed to be separated from the p-type electrode 156 in the horizontal direction on the n-type semiconductor layer 153. In this case, the p-type electrode 156 may be electrically connected to the welding portion 179 by the conductive adhesive layer 130, and the n-type electrode 152 may be electrically connected to the second electrode 140.

Referring to FIGS. 2, 3A and 3B again, the auxiliary electrode 170 may be formed in an elongated manner in one direction to be electrically connected to a plurality of semiconductor light-emitting elements 150. For example, the left and right p-type electrodes of the semiconductor light-emitting elements around the auxiliary electrode may be electrically connected to one auxiliary electrode.

More specifically, the semiconductor light-emitting element 150 is pressed into the conductive adhesive layer 130, and through this, only a portion between the p-type electrode 156 and auxiliary electrode 170 of the semiconductor light-emitting element 150 and a portion between the n-type electrode 152 and second electrode 140 of the semiconductor light-emitting element 150 have conductivity, and the remaining portion does not have conductivity since there is no push-down of the semiconductor light-emitting element. As described above, the conductive adhesive layer 130 may form an electrical connection as well as allow a mutual coupling between the semiconductor light-emitting element 150 and the auxiliary electrode 170 and between the semiconductor light-emitting element 150 and the second electrode 140.

Furthermore, a plurality of semiconductor light-emitting elements 150 constitute a light-emitting array, and a phosphor layer 180 is formed on the light-emitting array.

The light-emitting element array may include a plurality of semiconductor light-emitting elements with different self-luminance values. Each of the semiconductor light-emitting elements 150 constitutes a sub-pixel, and is electrically connected to the first electrode 120. For example, there may exist a plurality of first electrodes 120, and the semiconductor light-emitting elements are arranged in several rows, for instance, and each row of the semiconductor light-emitting elements may be electrically connected to any one of the plurality of first electrodes.

Furthermore, the semiconductor light-emitting elements may be connected in a flip chip form, and thus semiconductor light-emitting elements grown on a transparent dielectric substrate. Furthermore, the semiconductor light-emitting elements may be nitride semiconductor light-emitting elements, for instance. The semiconductor light-emitting element 150 has an excellent luminance characteristic, and thus it may be possible to configure individual sub-pixels even with a small size thereof.

According to the drawing, a partition wall 190 may be formed between the semiconductor light-emitting elements 150. In this case, the partition wall 190 may perform the role of dividing individual sub-pixels from one another, and be formed as an integral body with the conductive adhesive layer 130. For example, a base member of the anisotropic conductive film may form the partition wall when the semiconductor light-emitting element 150 is inserted into the anisotropic conductive film.

Furthermore, when the base member of the anisotropic conductive film is black, the partition wall 190 may have reflective characteristics while at the same time increasing contrast with no additional black insulator.

For another example, a reflective partition wall may be separately provided with the partition wall 190. In this case, the partition wall 190 may include a black or white insulator according to the purpose of the display device. It may have an effect of enhancing reflectivity when the partition wall of the while insulator is used, and increase contrast while at the same time having reflective characteristics.

The phosphor layer 180 may be located at an outer surface of the semiconductor light-emitting element 150. For example, the semiconductor light-emitting element 150 is a blue semiconductor light-emitting element that emits blue (B) light, and the phosphor layer 180 performs the role of converting the blue (B) light into the color of a sub-pixel. The phosphor layer 180 may be a red phosphor layer 181 or green phosphor layer 182 constituting individual pixels.

In other words, a red phosphor 181 capable of converting blue light into red (R) light may be deposited on the blue semiconductor light-emitting element 151 at a position implementing a red sub-pixel, and a green phosphor 182 capable of converting blue light into green (G) light may be deposited on the blue semiconductor light-emitting element 151 at a position implementing a green sub-pixel. Furthermore, only the blue semiconductor light-emitting element 151 may be solely used at a location implementing a blue sub-pixel. In this case, the red (R), green (G) and blue (B) sub-pixels may implement one pixel. More specifically, one color phosphor may be deposited along each line of the first electrode 120. Accordingly, one line on the first electrode 120 may be an electrode controlling one color. In other words, red (R), green (B) and blue (B) may be sequentially disposed along the second electrode 140, thereby implementing sub-pixels.

However, the present disclosure may not be necessarily limited to this, and the semiconductor light-emitting element 150 may be combined with a quantum dot (QD) instead of a phosphor to implement sub-pixels such as red (R), green (G) and blue (B).

Furthermore, a black matrix 191 may be disposed between each phosphor layer to enhance contrast. In other words, the black matrix 191 can enhance the contrast of luminance.

However, the present disclosure may not be necessarily limited to this, and another structure for implementing blue, red and green may be also applicable thereto.

Figure 5A:
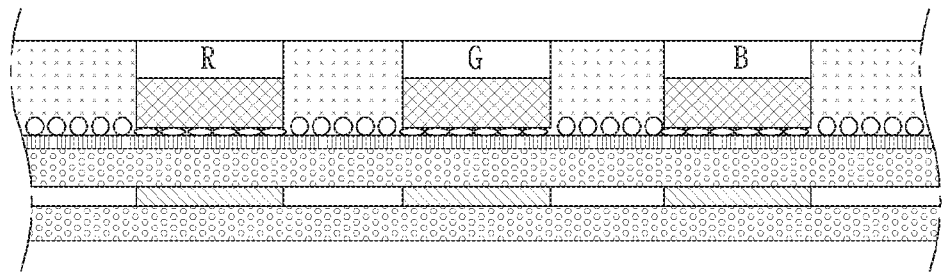
FIGS. 5A through 5C are conceptual views illustrating various forms for implementing colors in connection with a flip-chip type semiconductor light-emitting element.

Referring to FIG. 5A, each of the semiconductor light-emitting elements 150 may be implemented with a high-power light-emitting element that emits various lights including blue in which gallium nitride (GaN) is mostly used, and indium (In) and or aluminum (Al) are added thereto.

In this case, the semiconductor light-emitting element 150 may be red, green and blue semiconductor light-emitting elements, respectively, to implement each sub-pixel. For instance, red, green and blue semiconductor light-emitting elements (R, G, B) are alternately disposed, and red, green and blue sub-pixels implement one pixel by means of the red, green and blue semiconductor light-emitting elements, thereby implementing a full color display.

Figure 5B:
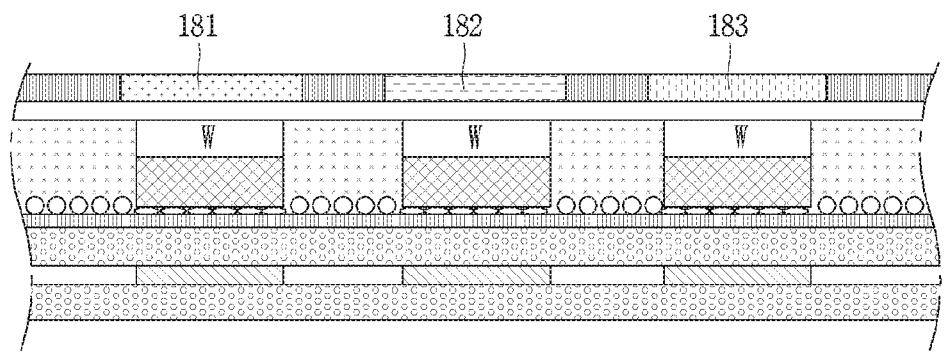

Referring to FIG. 5B, the semiconductor light-emitting element may have a white light-emitting element (W) provided with a yellow phosphor layer for each element. In this case, a red phosphor layer 181, a green phosphor layer 182 and blue phosphor layer 183 may be provided on the white light-emitting element (W) to implement a sub-pixel. Furthermore, a color filter repeated with red, green and blue on the white light-emitting element (W) may be used to implement a sub-pixel.

Figure 5C:
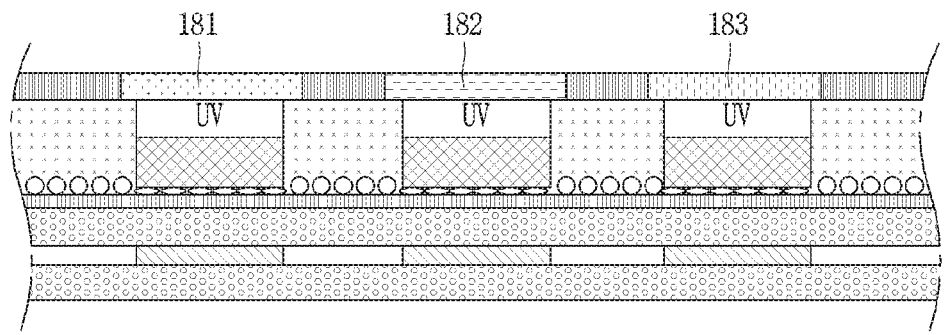

Referring to FIG. 5C, it may be possible to also have a structure in which a red phosphor layer 181, a green phosphor layer 182 and blue phosphor layer 183 may be provided on an ultra violet light-emitting element (UV). In this manner, the semiconductor light-emitting element can be used over the entire region up to ultra violet (UV) as well as visible light, and may be extended to a form of semiconductor light-emitting element in which ultra violet (UV) can be used as an excitation source.

Taking the present example into consideration again, the semiconductor light-emitting element 150 is placed on the conductive adhesive layer 130 to configure a sub-pixel in the display device. The semiconductor light-emitting element 150 may have excellent luminance characteristics, and thus it may be possible to configure individual sub-pixels even with a small size thereof. The size of the individual semiconductor light-emitting element 150 may be less than 80 μm in the length of one side thereof, and formed with a rectangular or square shaped element. In case of a rectangular shaped element, the size thereof may be less than 20×80 μm.

Furthermore, even when a square shaped semiconductor light-emitting element 150 with a length of side of 10 μm is used for a sub-pixel, it will exhibit a sufficient brightness for implementing a display device. Accordingly, for example, in case of a rectangular pixel in which one side of a sub-pixel is 600 μm in size, and the remaining one side thereof is 300 μm, a relative distance between the semiconductor light-emitting elements becomes sufficiently large. Accordingly, in this case, it may be possible to implement a flexible display device having a HD image quality.

A display device using the foregoing semiconductor light-emitting element will be fabricated by a new type of fabrication method. Hereinafter, the fabrication method will be described with reference to FIG. 6.

Figure 6:
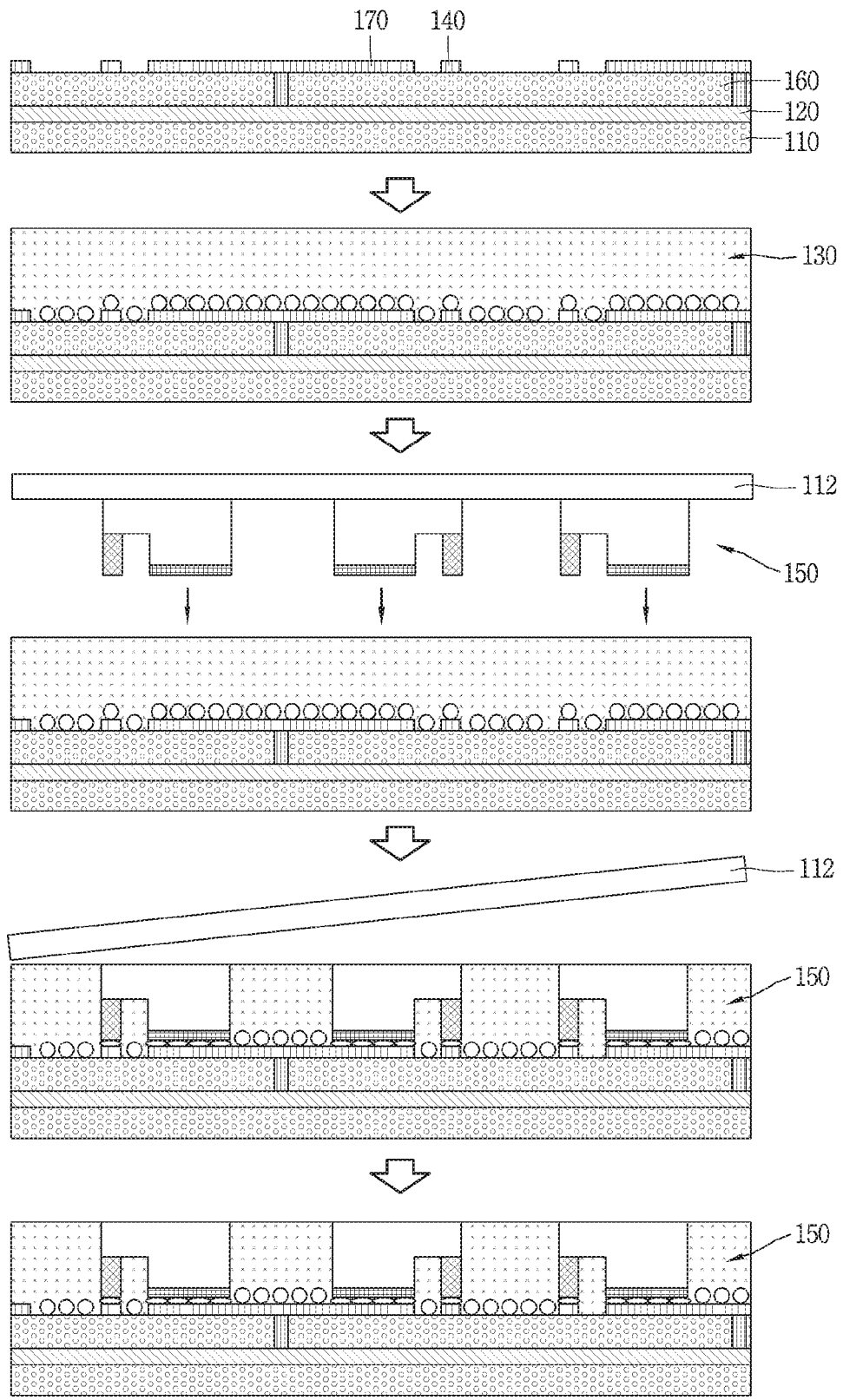
FIG. 6 is cross-sectional views illustrating a fabrication method of a display device using a semiconductor light-emitting element according to the present disclosure.

FIG. 6 is cross-sectional views illustrating a fabrication method of a display device using a semiconductor light-emitting element according to the present disclosure.

Referring to the drawing, first, the conductive adhesive layer 130 is formed on the insulating layer 160 located with the auxiliary electrode 170 and second electrode 140. The insulating layer 160 is deposited on the first substrate 110 to form one substrate (or wiring substrate), and the first electrode 120, auxiliary electrode 170 and second electrode 140 are disposed at the wiring substrate. In this case, the first electrode 120 and second electrode 140 may be disposed in a perpendicular direction to each other. Furthermore, the first substrate 110 and insulating layer 160 may contain glass or polyimide (PI), respectively, to implement a flexible display device.

The conductive adhesive layer 130 may be implemented by an anisotropic conductive film, for example, and to this end, an anisotropic conductive film may be coated on a substrate located with the insulating layer 160.

Next, a second substrate 112 located with a plurality of semiconductor light-emitting elements 150 corresponding to the location of the auxiliary electrodes 170 and second electrodes 140 and constituting individual pixels is disposed such that the semiconductor light-emitting element 150 faces the auxiliary electrode 170 and second electrode 140.

In this case, the second substrate 112 as a growth substrate for growing the semiconductor light-emitting element 150 may be a sapphire substrate or silicon substrate.

The semiconductor light-emitting element may have a gap and size capable of implementing a display device when formed in the unit of wafer, and thus effectively used for a display device.

Next, the wiring substrate is thermally compressed to the second substrate 112. For example, the wiring substrate and second substrate 112 may be thermally compressed to each other by applying an ACF press head. The wiring substrate and second substrate 112 are bonded to each other using the thermal compression. Only a portion between the semiconductor light-emitting element 150 and the auxiliary electrode 170 and second electrode 140 may have conductivity due to the characteristics of an anisotropic conductive film having conductivity by thermal compression, thereby allowing the electrodes and semiconductor light-emitting element 150 to be electrically connected to each other. At this time, the semiconductor light-emitting element 150 may be inserted into the anisotropic conductive film, thereby forming a partition wall between the semiconductor light-emitting elements 150.

Next, the second substrate 112 is removed. For example, the second substrate 112 may be removed using a laser lift-off (LLO) or chemical lift-off (CLO) method.

Finally, the second substrate 112 is removed to expose the semiconductor light-emitting elements 150 to the outside. Silicon oxide (SiOx) or the like may be coated on the wiring substrate coupled to the semiconductor light-emitting element 150 to form a transparent insulating layer (not shown).

Furthermore, it may further include the process of forming a phosphor layer on one surface of the semiconductor light-emitting element 150. For example, the semiconductor light-emitting element 150 may be a blue semiconductor light-emitting element for emitting blue (B) light, and red or green phosphor for converting the blue (B) light into the color of the sub-pixel may form a layer on one surface of the blue semiconductor light-emitting element.

The fabrication method or structure of a display device using the foregoing semiconductor light-emitting element may be modified in various forms. For such an example, the foregoing display device may be applicable to a vertical semiconductor light-emitting element. Hereinafter, the vertical structure will be described with reference to FIGS. 5 and 6.

Furthermore, according to the following modified example or embodiment, the same or similar reference numerals are designated to the same or similar configurations to the foregoing example, and the description thereof will be substituted by the earlier description.

Figure 7:
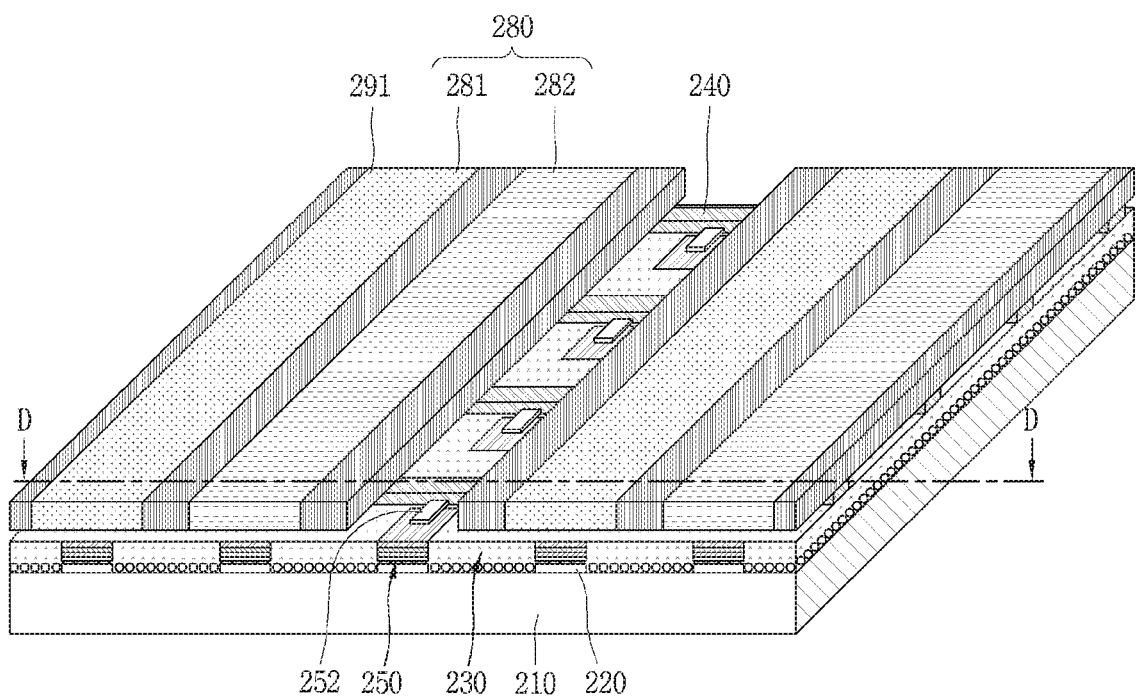
FIG. 7 is a perspective view illustrating a display device using a semiconductor light-emitting element according to another embodiment of the present disclosure.
Figure 8:
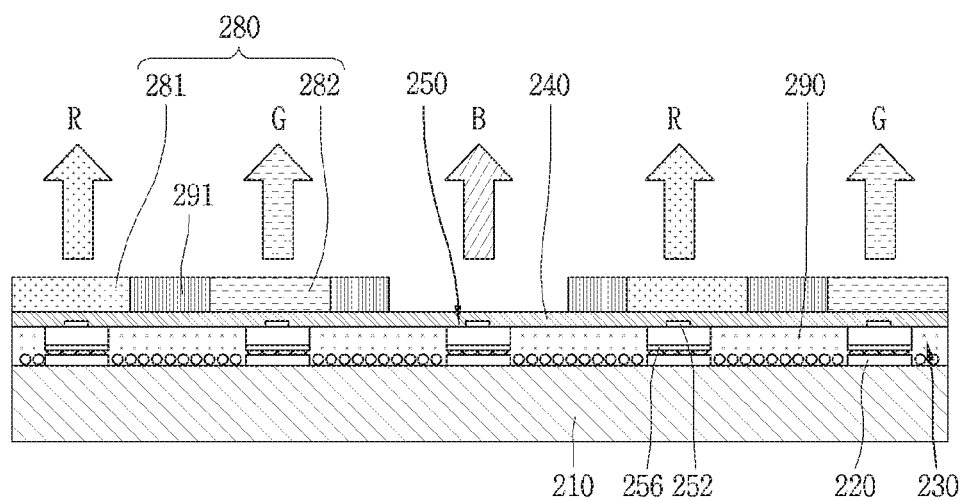
FIG. 8 is a cross-sectional view taken along line D-D in FIG. 7.
Figure 9:
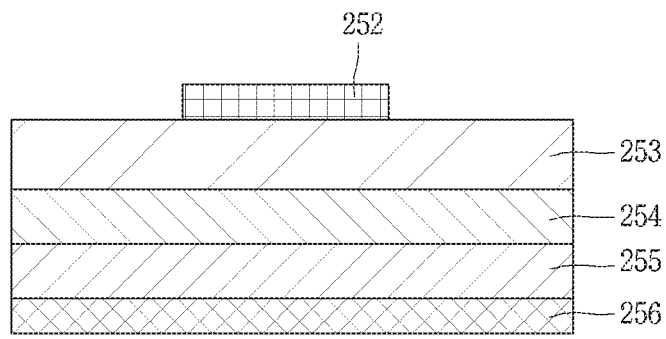
FIG. 9 is a conceptual view illustrating a vertical type semiconductor light-emitting element in FIG. 8.

FIG. 7 is a perspective view illustrating a display device using a semiconductor light-emitting element according to another embodiment of the present disclosure. FIG. 8 is a cross-sectional view taken along line C-C in FIG. 7, and FIG. 9 is a conceptual view illustrating a vertical type semiconductor light-emitting element in FIG. 8.

According to the drawings, the display device may be display device using a passive matrix (PM) type of vertical semiconductor light-emitting element.

The display device may include a substrate 210, a first electrode 220, a conductive adhesive layer 230, a second electrode 240 and a plurality of semiconductor light-emitting elements 250.

The substrate 210 as a wiring substrate disposed with the first electrode 220 may include polyimide (PI) to implement a flexible display device. In addition, any one may be used if it is an insulating and flexible material.

The first electrode 220 may be located on the substrate 210, and formed with a bar-shaped electrode elongated in one direction. The first electrode 220 may be formed to perform the role of a data electrode.

The conductive adhesive layer 230 is formed on the substrate 210 located with the first electrode 220. Similarly to a display device to which a flip chip type light-emitting element is applied, the conductive adhesive layer 230 may be an anisotropic conductive film (ACF), an anisotropic conductive paste, a solution containing conductive particles, and the like. However, the present embodiment illustrates a case where the conductive adhesive layer 230 is implemented by an anisotropic conductive film.

When an anisotropic conductive film is located in a state that the first electrode 220 is located on the substrate 210, and then heat and pressure are applied to connect the semiconductor light-emitting element 250 thereto, the semiconductor light-emitting element 250 is electrically connected to the first electrode 220. At this time, the semiconductor light-emitting element 250 may be preferably disposed on the first electrode 220.

The electrical connection is generated because an anisotropic conductive film partially has conductivity in the thickness direction when heat and pressure are applied as described above. Accordingly, the anisotropic conductive film is partitioned into a portion 231 having conductivity and a portion 232 having no conductivity in the thickness direction thereof.

Furthermore, the anisotropic conductive film contains an adhesive component, and thus the conductive adhesive layer 230 implements a mechanical coupling as well as an electrical coupling between the semiconductor light-emitting element 250 and the first electrode 220.

In this manner, the semiconductor light-emitting element 250 is placed on the conductive adhesive layer 230, thereby configuring a separate sub-pixel in the display device. The semiconductor light-emitting element 250 may have excellent luminance characteristics, and thus it may be possible to configure individual sub-pixels even with a small size thereof. The size of the individual semiconductor light-emitting element 250 may be less than 80 µm in the length of one side thereof, and formed with a rectangular or square shaped element. In case of a rectangular shaped element, the size thereof may be less than 20×80 µm.

The semiconductor light-emitting element 250 may be a vertical structure.

A plurality of second electrodes 240 disposed in a direction of crossing the length direction of the first electrode 220, and electrically connected to the vertical semiconductor light-emitting element 250 may be located between vertical semiconductor light-emitting elements.

Referring to FIG. 9, the vertical semiconductor light-emitting element may include a p-type electrode 256, a p-type semiconductor layer 255 formed with the p-type electrode 256, an active layer 254 formed on the p-type semiconductor layer 255, an n-type semiconductor layer 253 formed on the active layer 254, and an n-type electrode 252 formed on the n-type semiconductor layer 253. In this case, the p-type electrode 256 located at the bottom thereof may be electrically connected to the first electrode 220 by the conductive adhesive layer 230, and the n-type electrode 252 located at the top thereof may be electrically connected to the second electrode 240 which will be described later. The electrodes may be disposed in the upward/downward direction in the vertical semiconductor light-emitting element 250, thereby providing a great advantage capable of reducing the chip size.

Referring again to FIG. 8, a phosphor layer 280 may be formed on one surface of the semiconductor light-emitting element 250. For example, the semiconductor light-emitting element 250 is a blue semiconductor light-emitting element 251 that emits blue (B) light, and the phosphor layer 280 for converting the blue (B) light into the color of the sub-pixel may be provided thereon. In this case, the phosphor layer 280 may be a red phosphor 281 and a green phosphor 282 constituting individual pixels.

In other words, a red phosphor 281 capable of converting blue light into red (R) light may be deposited on the blue semiconductor light-emitting element 251 at a position implementing a red sub-pixel, and a green phosphor 282 capable of converting blue light into green (G) light may be deposited on the blue semiconductor light-emitting element 251 at a position implementing a green sub-pixel. Furthermore, only the blue semiconductor light-emitting element 251 may be solely used at a location implementing a blue sub-pixel. In this case, the red (R), green (G) and blue (B) sub-pixels may implement one pixel.

However, the present disclosure may not be necessarily limited to this, and another structure for implementing blue, red and green may be also applicable thereto as described above in a display device to which a flip chip type light-emitting element is applied.

Taking the present embodiment into consideration again, the second electrode 240 is located between the semiconductor light-emitting elements 250, and electrically connected to the semiconductor light-emitting elements 250. For example, the semiconductor light-emitting elements 250 may be disposed in a plurality of rows, and the second electrode 240 may be located between the rows of the semiconductor light-emitting elements 250.

Since a distance between the semiconductor light-emitting elements 250 constituting individual pixels is sufficiently large, the second electrode 240 may be located between the semiconductor light-emitting elements 250.

The second electrode 240 may be formed with a bar-shaped electrode elongated in one direction, and disposed in a perpendicular direction to the first electrode.

Furthermore, the second electrode 240 may be electrically connected to the semiconductor light-emitting element 250 by a connecting electrode protruded from the second electrode 240. More specifically, the connecting electrode may be an n-type electrode of the semiconductor light-emitting element 250. For example, the n-type electrode is formed with an ohmic electrode for ohmic contact, and the second electrode covers at least part of the ohmic electrode by printing or deposition. Through this, the second electrode 240 may be electrically connected to the n-type electrode of the semiconductor light-emitting element 250.

According to the drawing, the second electrode 240 may be located on the conductive adhesive layer 230. According to circumstances, a transparent insulating layer (not shown) containing silicon oxide (SiOx) may be formed on the substrate 210 formed with the semiconductor light-emitting element 250. When the transparent insulating layer is formed and then the second electrode 240 is placed thereon, the second electrode 240 may be located on the transparent insulating layer. Furthermore, the second electrode 240 may be formed to be separated from the conductive adhesive layer 230 or transparent insulating layer.

If a transparent electrode such as indium tin oxide (ITO) is used to locate the second electrode 240 on the semiconductor light-emitting element 250, the ITO material has a problem of bad adhesiveness with an n-type semiconductor. Accordingly, the second electrode 240 may be placed between the semiconductor light-emitting elements 250, thereby obtaining an advantage in which the transparent electrode is not required. Accordingly, an n-type semiconductor layer and a conductive material having a good adhesiveness may be used as a horizontal electrode without being restricted by the selection of a transparent material, thereby enhancing the light extraction efficiency.

According to the drawing, a partition wall 290 may be formed between the semiconductor light-emitting elements 250. In other words, the partition wall 290 may be disposed between the vertical semiconductor light-emitting elements 250 to isolate the semiconductor light-emitting element 250 constituting individual pixels. In this case, the partition wall 290 may perform the role of dividing individual sub-pixels from one another, and be formed as an integral body with the conductive adhesive layer 230. For example, a base member of the anisotropic conductive film may form the partition wall when the semiconductor light-emitting element 250 is inserted into the anisotropic conductive film.

Furthermore, when the base member of the anisotropic conductive film is black, the partition wall 290 may have reflective characteristics while at the same time increasing contrast with no additional black insulator.

For another example, a reflective partition wall may be separately provided with the partition wall 290. In this case, the partition wall 290 may include a black or white insulator according to the purpose of the display device.

If the second electrode 240 is precisely located on the conductive adhesive layer 230 between the semiconductor light-emitting elements 250, the partition wall 290 may be located between the semiconductor light-emitting element 250 and second electrode 240. Accordingly, individual sub-pixels may be configured even with a small size using the semiconductor light-emitting element 250, and a distance between the semiconductor light-emitting elements 250 may be relatively sufficiently large to place the second electrode 240 between the semiconductor light-emitting elements 250, thereby having the effect of implementing a flexible display device having a HD image quality.

Furthermore, according to the drawing, a black matrix 291 may be disposed between each phosphor layer to enhance contrast. In other words, the black matrix 291 can enhance the contrast of luminance.

As described above, the semiconductor light-emitting element 250 is located on the conductive adhesive layer 230, thereby constituting individual pixels on the display device. The semiconductor light-emitting element 250 may have excellent luminance characteristics, and thus it may be possible to configure individual sub-pixels even with a small size thereof. As a result, it may be possible to implement a full color display in which the sub-pixels of red (R), green (G) and blue (B) implement one pixel by means of the semiconductor light-emitting element.

In a display device using the foregoing semiconductor light-emitting element of the present disclosure, when a flip chip type is applied thereto, the first and second electrodes are disposed on the same plane, thereby causing a problem in which it is difficult to realize a fine pitch. Hereinafter, a display device to which a flip chip type light-emitting element according to another embodiment of the present disclosure capable of solving such a problem is applied will be described.

Figure 10:
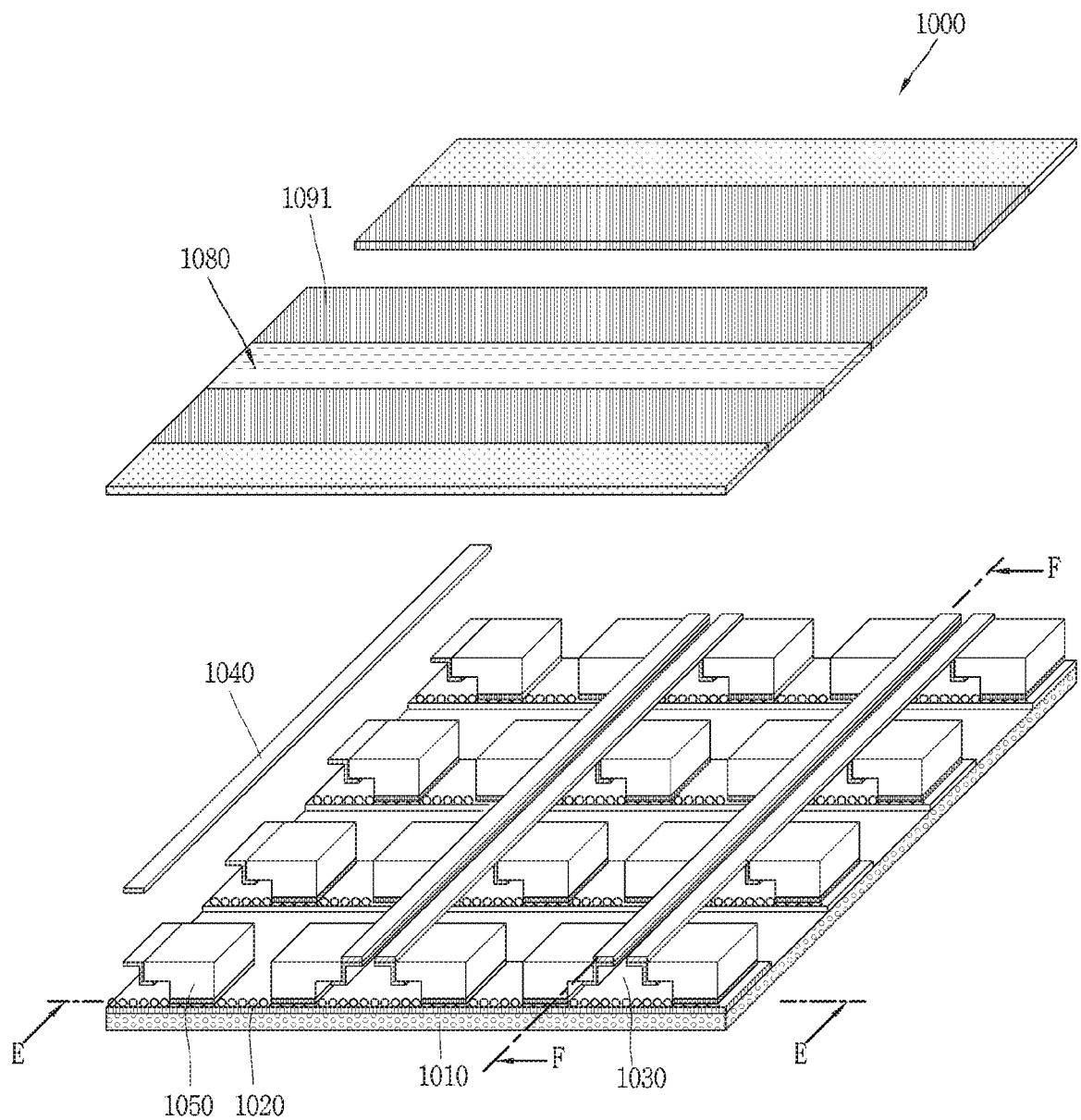
FIG. 10 is an enlarged view of portion "A" in FIG. 1 for explaining another embodiment of the present disclosure to which a semiconductor light-emitting element having a new structure is applied.
Figure 11A:
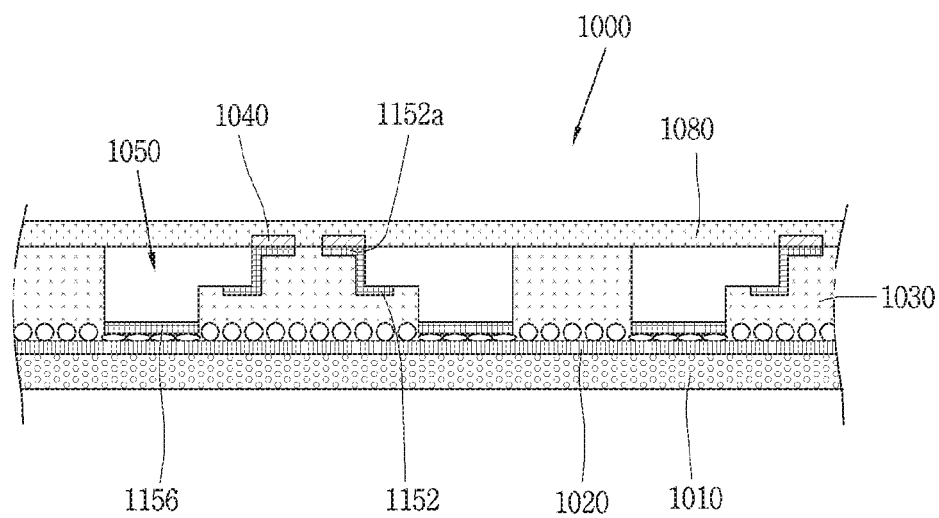
FIG. 11A is a cross-sectional view taken along line E-E in FIG. 10.
Figure 11B:
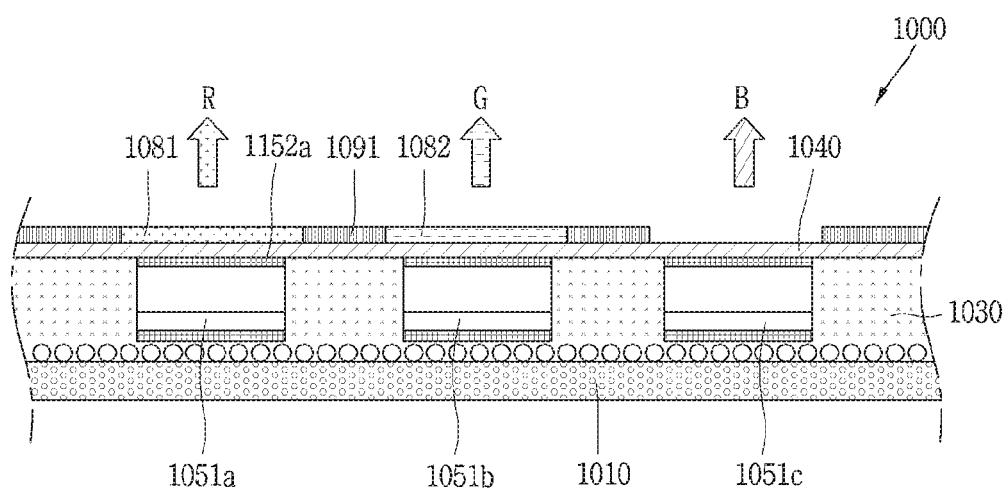
FIG. 11B is a cross-sectional view taken along line F-F in FIG. 11.
Figure 12:
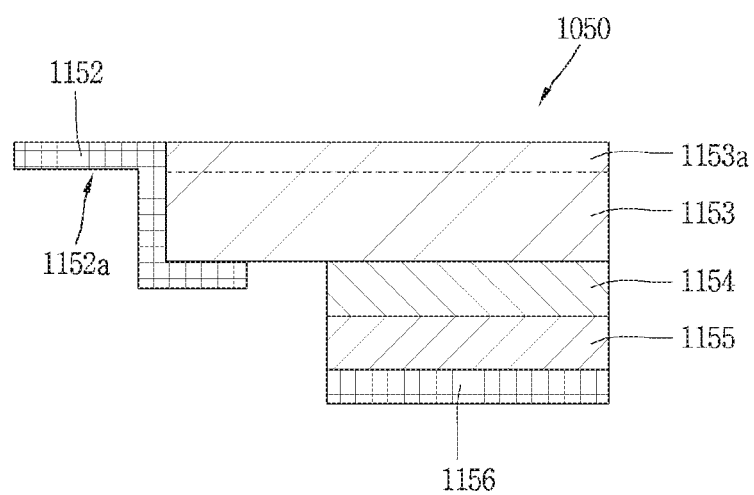
FIG. 12 is a conceptual view illustrating a flip chip type semiconductor light-emitting element in FIG. 11A.

FIG. 10 is an enlarged view of portion "A" in FIG. 1 for explaining another embodiment of the present disclosure to which a semiconductor light-emitting element having a new structure is applied, FIG. 11A is a cross-sectional view taken along line E-E in FIG. 10, FIG. 11B is a cross-sectional view taken along line F-F in FIG. 11, and FIG. 12 is a conceptual view illustrating a flip chip type semiconductor light-emitting element in FIG. 11A.

According to the drawings in FIGS. 10, 11A and 11B, there is illustrated a display device 1000 using a passive matrix (PM) type semiconductor light-emitting element as a display device 1000 using a semiconductor light-emitting element. However, an example described below may also be applicable to an active matrix (AM) type semiconductor light-emitting element.

The display device 1000 may include a substrate 1010, a first electrode 1020, a conductive adhesive layer 1030, a second electrode 1040, and a plurality of semiconductor light-emitting elements 1050. Here, the first electrode 1020 and the second electrode 1040 may respectively include a plurality of electrode lines.

The substrate 1010 as a wiring substrate disposed with the first electrode 1020 may include polyimide (PI) to implement a flexible display device. In addition, any one may be used if it is an insulating and flexible material.

The first electrode 1020 may be located on the substrate 1010, and formed with a bar-shaped electrode elongated in one direction. The first electrode 1020 may be formed to perform the role of a data electrode.

The conductive adhesive layer 1030 is formed on the substrate 1010 located with the first electrode 1020. Similarly to a display device to which the foregoing flip chip type light-emitting element is applied, the conductive adhesive layer 1030 may be an anisotropic conductive film (ACF), an anisotropic conductive paste, a solution containing conductive particles, and the like. However, in the present embodiment, the conductive adhesive layer 1030 may be replaced with an adhesive layer. For example, when the first electrode 1020 is not located on the substrate 1010 but formed integrally with the conductive electrode of the semiconductor light-emitting element, the adhesive layer may not need to have conductivity.

A plurality of second electrodes 1040 disposed in a direction of crossing the length direction of the first electrode 1020, and electrically connected to the semiconductor light-emitting element 1050 may be located between the semiconductor light-emitting elements.

According to the drawing, the second electrode 1040 may be located on the conductive adhesive layer 1030. In other words, the conductive adhesive layer 1030 is disposed between the wiring substrate and the second electrode 1040. The second electrode 1040 may be electrically connected by contact with the semiconductor light-emitting element 1050.

A plurality of semiconductor light-emitting elements 1050 are coupled to the conductive adhesive layer 1030, and electrically connected to the first electrode 1020 and the second electrode 1040 by the foregoing structure.

According to circumstances, a transparent insulating layer (not shown) containing silicon oxide (SiOx) may be formed on the substrate 1010 formed with the semiconductor light-emitting element 1050. When the transparent insulating layer is formed and then the second electrode 1040 is placed thereon, the second electrode 1040 may be located on the transparent insulating layer. Furthermore, the second electrode 1040 may be formed to be separated from the conductive adhesive layer 1030 or transparent insulating layer.

As shown in the drawing, the plurality of semiconductor light-emitting elements 1050 may form a plurality of columns in a direction parallel to a plurality of electrode lines provided in the first electrode 1020. However, the present disclosure is not necessarily limited thereto. For example, the plurality of semiconductor light-emitting elements 1050 may form a plurality of columns along the second electrode 1040.

Moreover, the display device 1000 may further include a phosphor layer 1080 formed on one surface of the plurality of semiconductor light-emitting elements 1050. For example, the semiconductor light-emitting element 1050 is a blue semiconductor light-emitting element that emits blue (B) light, and the phosphor layer 1080 performs the role of converting the blue (B) light into the color of a sub-pixel. The phosphor layer 1080 may be a red phosphor layer 1081 or green phosphor layer 1082 constituting individual pixels. In other words, a red phosphor 1081 capable of converting blue light into red (R) light may be deposited on the blue semiconductor light-emitting element 1051$a$ at a position implementing a red sub-pixel, and a green phosphor 1082 capable of converting blue light into green (G) light may be deposited on the blue semiconductor light-emitting element 1051$b$ at a position implementing a green sub-pixel. Furthermore, only the blue semiconductor light-emitting element 1051$c$ may be solely used at a location implementing a blue sub-pixel. In this case, the red (R), green (G) and blue (B) sub-pixels may implement one pixel. More specifically, one color phosphor may be deposited along each line of the first electrode 1020. Accordingly, one line on the first electrode 1020 may be an electrode controlling one color. In other words, red (R), green (B) and blue (B) may be sequentially disposed along the second electrode 1040, thereby implementing sub-pixels. However, the present disclosure may not be necessarily limited to this, and the semiconductor light-emitting element 1050 may be combined with a quantum dot (QD) instead of a phosphor to implement sub-pixels that emit red (R), green (G) and blue (B).

On the other hand, in order to improve the contrast of the phosphor layer 1080, the display device may further include a black matrix 1091 disposed between each phosphor. The black matrix 1091 may be formed in such a manner that a gap is formed between the phosphor dots and a black material fills the gap. Through this, the black matrix 1091 may improve contrast between light and dark while absorbing external light reflection. The black matrix 1091 is located between respective phosphor layers along the first electrode 1020 in a direction in which the phosphor layers 1080 are layered. In this case, a phosphor layer may not be formed at a position corresponding to the blue semiconductor light-emitting element 1051, but the black matrix 1091 may be respectively formed at both sides thereof by interposing a space that does not have the blue light-emitting element 1051$c$ therebetween.

Meanwhile, referring to the semiconductor light-emitting element 1050 according to the present example, the electrodes may be disposed in an upward/downward direction in the semiconductor light-emitting element 1050 in the present embodiment, thereby having a great advantage capable of reducing the chip size. However, the electrode may be disposed on the top and the bottom, but the semiconductor light-emitting element may be a flip chip type semiconductor light-emitting element.

Referring to FIG. 12, the semiconductor light-emitting element 1050 includes a first conductive electrode 1156, a first conductive semiconductor layer 1155 formed with the first conductive electrode 1156, an active layer 1154 formed on the first conductive semiconductor layer 1155, a second conductive semiconductor layer 1153 formed on the active layer 1154, and a second conductive electrode 1152 formed on the second conductive semiconductor layer 1153.

More specifically, the first conductive electrode 1156 and the first conductive semiconductor layer 1155 may be a p-type electrode and a p-type semiconductor layer, respectively, and the second conductive electrode 1152 and the second conductive semiconductor layer 1153 may be an n-type electrode and an n-type semiconductor layer, respectively. However, the present disclosure is not limited thereto, and the first conductive type may be n-type and the second conductive type may be p-type.

More specifically, the first conductive electrode 1156 is formed on one surface of the first conductive semiconductor layer 1155, and the active layer 1154 is formed on the other surface of the first conductive semiconductor layer 1155 and one surface of the second conductive semiconductor layer 1153, and the second conductive electrode 1152 is formed on one surface of the second conductive semiconductor layer 1153.

In this case, the second conductive electrode is disposed on one surface of the second conductive semiconductor layer 1153, and an undoped semiconductor layer 1153$a$ is formed on the other surface of the second conductive semiconductor layer 1153.

Referring to FIG. 12 together with FIGS. 10 through 11B, one surface of the second conductive semiconductor layer may be a surface closest to the wiring substrate, and the other surface of the second conductive semiconductor layer may be a surface farthest from the wiring substrate.

Furthermore, the first conductive electrode 1156 and the second conductive electrode 1152 may have a height difference from each other in width and vertical directions (or thickness direction) at positions spaced apart along the width direction of the semiconductor light-emitting element.

The second conductive electrode 1152 is formed on the second conductive semiconductor layer 1153 using the height difference, but disposed adjacent to the second electrode 1040 located at an upper side of the semiconductor light-emitting element. For example, at least part of the second conductive electrode 1152 may protrude from a side surface of the second conductive semiconductor layer 1153 (or a side surface of the undoped semiconductor layer 1153$a$). As described above, since the second conductive electrode 1152 protrudes from the side surface, the second conductive electrode 1152 may be exposed to an upper side of the semiconductor light-emitting element. Through this, the second conductive electrode 1152 is disposed at a position overlapping the second electrode 1040 disposed at an upper side of the conductive adhesive layer 1030.

More specifically, the semiconductor light-emitting element includes a protruding portion 1152$a$ extending from the second conductive electrode 1152, and protruding from a side surface of the plurality of semiconductor light-emitting elements. In this case, referring to the protruding portion 1152$a$ as a reference, the first conductive electrode 1156 and the second conductive electrode 1152 are disposed at positions spaced apart along the protruding direction of the protruding portion 1152$a$, and may be expressed such that they are formed to have a height difference from each other in a direction perpendicular to the protruding direction.

The protruding portion 1152a extends laterally from one surface of the second conductive semiconductor layer 1153, and extends to an upper surface of the second conductive semiconductor layer 1153, and more specifically, to the undoped semiconductor layer 1153a. The protruding portion 1152a protrudes along the width direction from a side surface of the undoped semiconductor layer 1153a. Accordingly, the protruding portion 1152a may be electrically connected to the second electrode 1040 on the opposite side of the first conductive electrode with respect to the second conductive semiconductor layer.

A structure including the protruding portion 1152a may be a structure capable of using the above-described horizontal semiconductor light-emitting element and vertical semiconductor light-emitting element. On the other hand, fine grooves may be formed by roughing on an upper surface farthest from the first conductive electrode 1156 on the undoped semiconductor layer 1153a.

According to the above-described display device, light emitted from the semiconductor light-emitting elements is excited using phosphors to implement red (R) and green (G). Furthermore, the above-described black matrices 191, 291, 1091 (refer to FIGS. 3B, 8 and 11B) serve as partition walls for preventing color mixing between the phosphors.

On the other hand, a structure in which light output from the semiconductor light-emitting elements is excited using yellow phosphor, and then filtered using a color filter to implement red (R) and green (G) may be applicable to the partition walls.

In this case, when patterning on inorganic phosphor is carried out by photolithography, shrinkage may occur due to the evaporation of solvent subsequent to patterning to cause a step between the color filter and the phosphor. A a result, there is a problem that photolithography has to be carried out plural times. In addition, this may cause a problem that the amount of red light becomes insufficient. Therefore, the present disclosure proposes a mechanism for solving such a problem.

Figure 13:
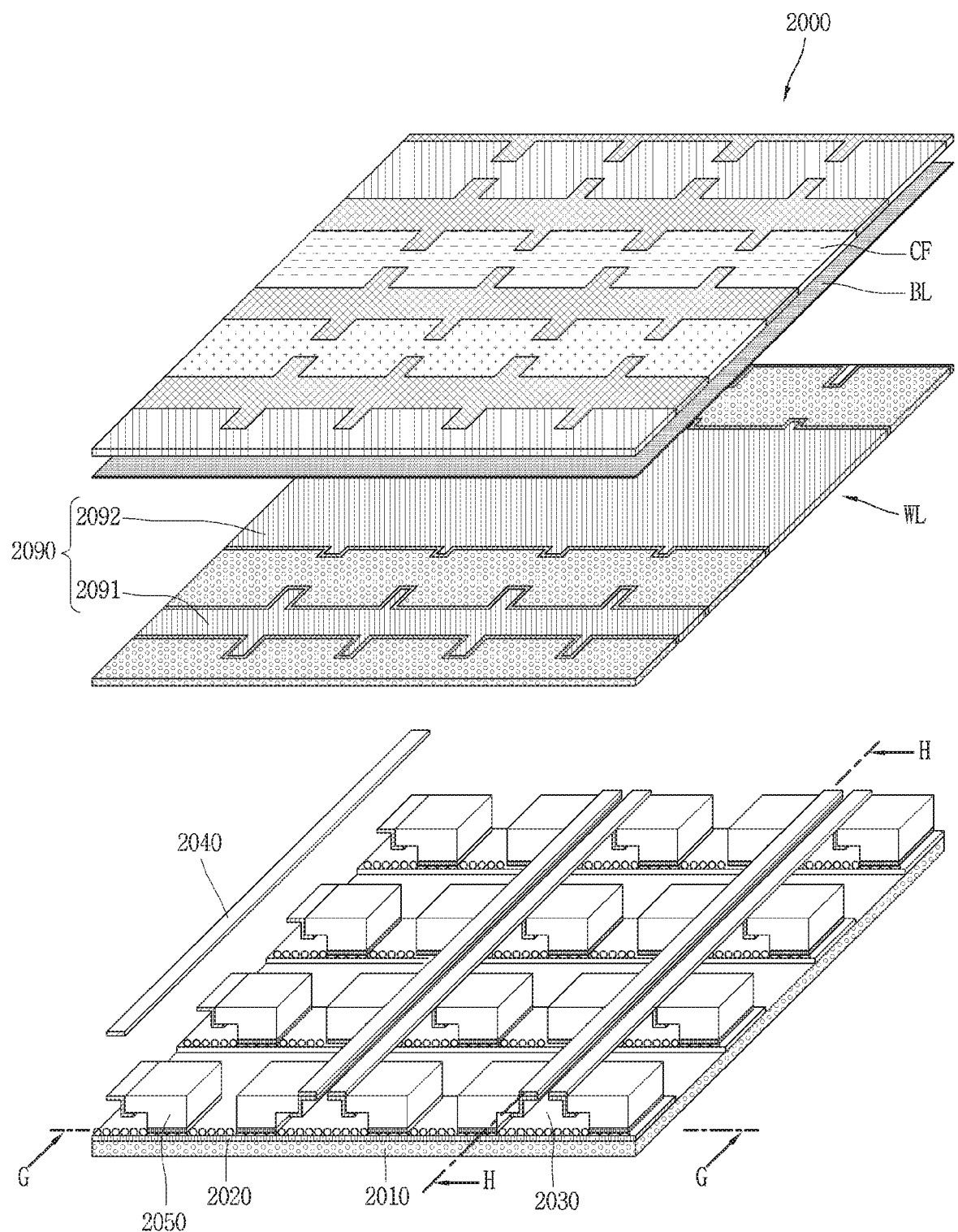
FIG. 13 is an enlarged view of portion "A" in FIG. 1 for explaining another embodiment of the present disclosure.
Figure 14:
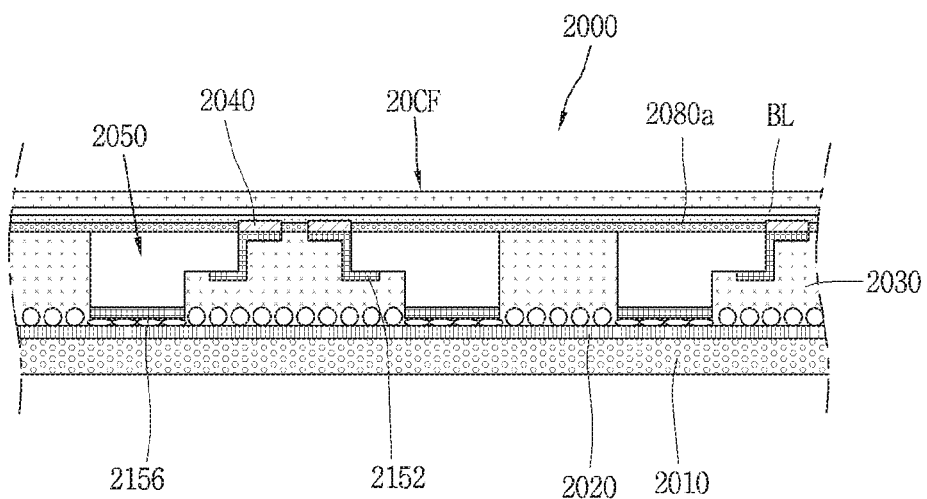
FIG. 14 is a cross-sectional view taken along line G-G in FIG. 13.
Figure 15:
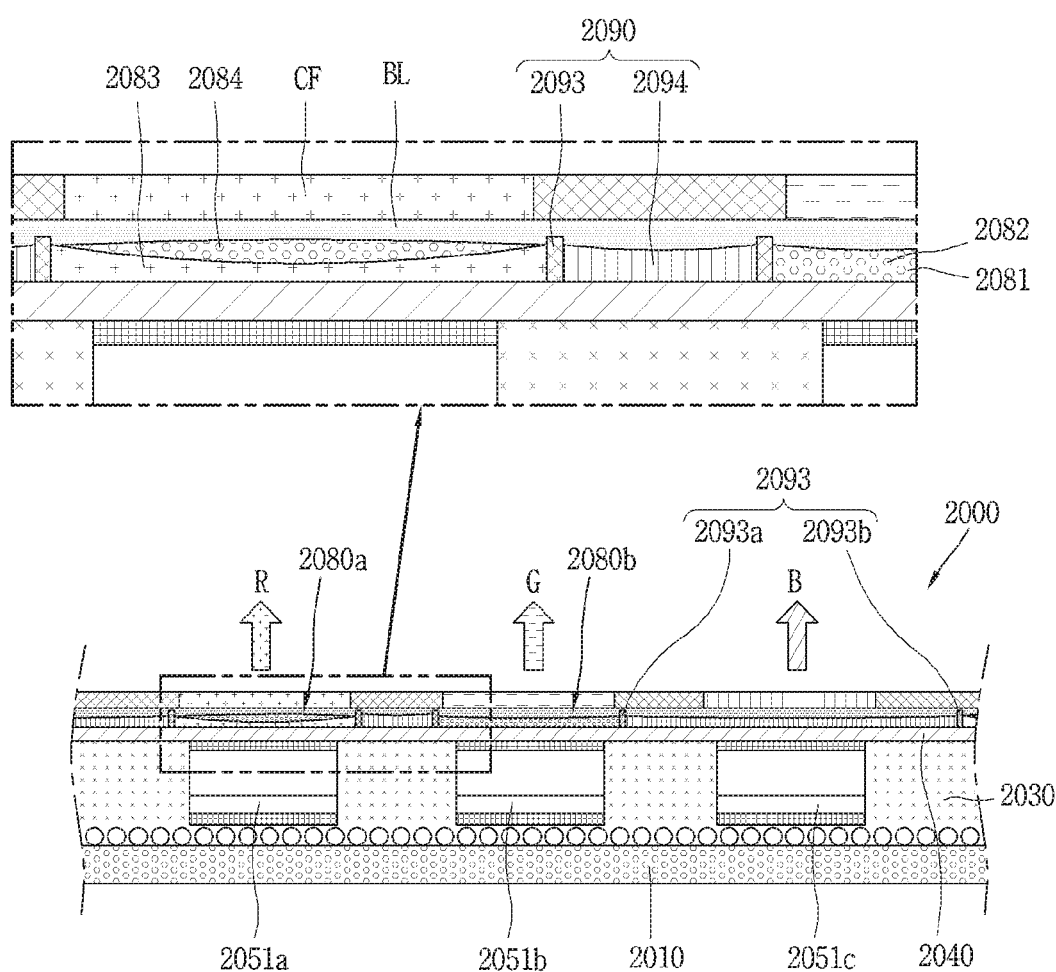
FIG. 15 is a cross-sectional view taken along line H-H in FIG. 13.

Hereinafter, the structure of a display device of the present disclosure will be described in detail with reference to the accompanying drawings. FIG. 13 is an enlarged view of portion "A" in FIG. 1 for explaining another embodiment of the present disclosure, and FIG. 14 is a cross-sectional view taken along line G-G in FIG. 13, and FIG. 15 is a cross-sectional view taken along line H-H in FIG. 13.

According to the drawings in FIGS. 13, 14 and 15, there is illustrated a display device 2000 using flip chip type semiconductor light-emitting elements described with reference to FIGS. 10 through 12 display device 1000 as a display device using semiconductor light-emitting elements. More specifically, there is illustrated a case in which a new phosphor layer structure is applied to a flip chip type semiconductor light-emitting element described with reference to FIGS. 10 through 12. However, an example described below is also applicable to a display device using another type of semiconductor light-emitting element described above.

In the present example to be described below, the same or similar reference numerals are designated to the same or similar components as those of the example described above with reference to FIGS. 10 through 12, and the description thereof will be substituted by the earlier description. For example, the display device 2000 includes a substrate 2010, a first electrode 2020, a conductive adhesive layer 2030, a second electrode 2040, and a plurality of semiconductor light-emitting elements 2050, and the descriptions thereof will be substituted by the description with reference to FIGS. 10 through 12 as described above. Therefore, in the present embodiment, the conductive adhesive layer 2030 may be replaced with an adhesive layer, and a plurality of semiconductor light-emitting elements may be attached to the adhesive layer disposed on the substrate 2010, and the first electrode 2020 may be integrally formed with a conductive electrode of the semiconductor light-emitting element without being located on the substrate 2010.

The second electrode 2040 may be located on the conductive adhesive layer 2030. In other words, the conductive adhesive layer 2030 is disposed between the wiring substrate and the second electrode 2040. The second electrode 2040 may be electrically connected by contact with the semiconductor light-emitting element 2050.

As described above, the display device 2000 may include a wavelength conversion layer (WL) disposed to cover a plurality of semiconductor light-emitting elements 2050. For example, the semiconductor light-emitting element 2050 is a blue semiconductor light-emitting element for emitting blue (B) light, and the wavelength conversion layer (WL) performs a function of converting the blue (B) light into a color such as yellow, white, red, green or the like. At this time, colors to be converted at the respective pixels may be different from each other. For such an example, it is possible to convert blue light into yellow light at a green pixel, and covert blue light into a wavelength in which red and yellow are mixed at a red pixel.

According to the drawings, the wavelength conversion layer (WL) includes a plurality of phosphor layers 2080 that converts a wavelength of light and a plurality of partition wall portions 2090 formed between the plurality of phosphor layers 2080.

The plurality of phosphor layers 2080 may include a first phosphor layer 2080a disposed at a position corresponding to a red pixel and a second phosphor layer 2080b disposed at a position corresponding to a green pixel. In this case, the first phosphor layer 2080a and the second phosphor layer 2080b may be provided with a yellow phosphor capable of converting the blue light of the blue semiconductor light-emitting element 2051a, 2051b into yellow light or white light.

On the other hand, one partition wall portion 2090 is disposed between the first phosphor layer 2080a and the second phosphor layer 2080b. In this case, at least one of the plurality of partition wall portions 2090 overlaps with at least one of the plurality of semiconductor light-emitting elements along a thickness direction of the phosphor layer 2080. Furthermore, at least one of the plurality of partition wall portions 2090 is configured to transmit light along the thickness direction of the phosphor layer 2080. More specifically, one partition wall portion 2091 is disposed on the blue semiconductor light-emitting element 2051c in a portion constituting a blue pixel, and light emitted from the blue semiconductor light-emitting element 2051c is transmitted without any conversion of color.

In this case, a phosphor layer or a partition wall portion may be formed along each line of the first electrode 2020. Accordingly, one line on the first electrode 2020 may be an electrode controlling one color. Furthermore, red (R), green (B) and blue (B) may be sequentially disposed along the second electrode 2040, thereby implementing sub-pixels. However, the present disclosure may not be necessarily limited to this, and quantum dot (GD) instead of phosphor may be filled into the phosphor layer to implement sub-pixels that emit red (R), green (G) and blue (B).

According to the illustration, a color filter (CF) is disposed to cover the wavelength conversion layer (WL). More specifically, the color filter (CF) and the wavelength conversion layer (WL) may be combined by an adhesive layer (BL). For example, as the adhesive layer (BL) is disposed between the color filter (CF) and the wavelength conversion layer (WL), the color filter (CF) may be adhered to the wavelength conversion layer (WL).

In this case, the color filter (CF) is configured to selectively transmit light to implement red, green and blue colors. The color filter (CF) may be provided with respective portions for filtering a red wavelength, a green wavelength, and a blue wavelength, and each of the portions to have a structure in which the respective portions are repeatedly arranged. At this time, a portion for filtering red and a portion for filtering green may be disposed at an upper side of the first phosphor layer 2080a and the second phosphor layer 2080b, and a portion for filtering blue may be disposed to cover the partition wall portion 2091 at a portion forming a blue pixel. A black matrix may be disposed between the filtering portions.

As described above, in this example, the phosphor layer 2080, the partition wall portion 2090 may be combined with the color filter (CF) to implement red, green, and blue unit pixels.

On the other hand, the plurality of partition wall portions 2090 may include a first partition wall portion 2091 and a second partition wall portion 2092.

The first partition wall portion 2091 is disposed to cover a space between the plurality of semiconductor light-emitting elements. More specifically, the first partition 2091 is located at a portion where a blue pixel is not disposed in a space between the first phosphor layer 2080a and the second phosphor layer 2080b that are repeatedly formed. Therefore, the semiconductor light-emitting element is not disposed under the first partition wall portion 2091.

Meanwhile, the second partition wall portion 2092 is configured to cover at least one of the plurality of semiconductor light-emitting elements. In this case, at least one of the plurality of semiconductor light-emitting elements covered by the second partition wall portion 2092 includes the blue semiconductor light-emitting element 2051c. In other words, the second partition wall portion 2092 is located at a portion where a blue pixel is not disposed in a space between a first phosphor layer 2080a and a second phosphor layer 2080b that are repeatedly formed. Therefore, the blue semiconductor light-emitting element 2051c is disposed under the second partition wall portion 2092.

In order to implement the foregoing structure, the first partition wall portion 2091 and the second partition wall portion 2092 are respectively formed in a unit pixel that emits red (R), green (G), and blue (B). Furthermore, the first partition wall portion 2091 and the second partition wall portion 2092 may be formed to have different widths (W) formed along a direction perpendicular to the thickness direction of the phosphor layer 2080. In this case, the width of the first partition wall portion 2091 is formed smaller than that of the second partition wall portion 2092. The width of the second partition wall portion 2092 is greater than or equal to that of the semiconductor light-emitting element 2050, and thus the width of the first partition wall portion 2091 is greater than that of the semiconductor light-emitting element 2050.

Describing the structure of the partition wall portions 2090 in more detail with reference to FIGS. 14 and 15, at least one of the plurality of partition wall portions 2090 is provided with one or more thin metal layers 2093 formed at edges thereof, and a light transmitting material 2094 is filled into a space between the thin metal layers 2093.

The light transmitting material 2094 is a material having a high transmittance in a visible light region, and an epoxy-based PR (photoresist), PDMS (polydimethylsiloxane), resin or the like may be used, for example. These materials are suitable for use as a material for a partition wall portion applied to a flexible display, since they do not have a property of being rigid at high temperatures.

For example, the thin metal layers 2093 are configured to cover a side surface of the phosphor layer 2080 to reflect light.

The thin metal layers 2093 may include a first thin metal layer 2093a disposed at one side edge of the partition wall portions 2090 and a second thin metal layer 2093b disposed at the other side edge. The first thin metal layer 2093a and the second thin metal layer 2093b may each have a thickness of 50 to 1000 nanometers. More specifically, the first thin metal layer 2093a and the second thin metal layer 2093b may each have a thickness of 100 to 200 nanometers.

The thin metal layers 2093 do not exist at upper and lower ends of the partition wall portion. In other words, the first thin metal layer 2093a and the second thin metal layer 2093b are separated from each other along the width direction of the partition wall portion 2090. Through this structure, light transmitted through the light transmitting material may be output from an upper end of the partition wall portion 2090 to the outside.

The first thin metal layer 2093a and the second thin metal layer 2093b are formed of a metal material such as aluminum or silver having a high reflectance in the visible light region to reflect light, thereby preventing color mixture between the phosphor layers. However, the present disclosure is not be necessarily limited thereto, and, for example, the thin metal layer may be replaced with an oxide thin film such as TiOx or CrOx, or a distribute Bragg reflector (DBR) structure may be applicable thereto.

The thin metal layers 2093 are formed of a single thin metal layer as illustrated in the drawing, but the present disclosure is not necessarily limited thereto. For example, the thin metal layers 2093 may be formed of a multilayer thin metal layer. For another example, an insulating film may be formed between the thin metal layer 2093 and the light transmitting material. The insulating layer may be formed of an opaque material such as SiO2, SiNx, or the like. For another example, the insulating film may be a black matrix. In this case, the black matrix may exhibit an additional effect of improving the contrast.

On the other hand, referring to the drawings, at least one of the plurality of phosphor layers 2080a, 2080b may be composed of a plurality of layers in which red phosphor overlaps with yellow phosphor. For example, the first phosphor layer 2080a is provided with the plurality of layers, and phosphor provided in the second phosphor layer 2080b may be yellow phosphor.

More specifically, the second phosphor layer 2080b is formed as a single layer provided with the yellow phosphor. The second phosphor layer 2080b is formed by mixing yellow phosphor 2082 (second phosphor) into a resin 2081. At this time, at least part of the resin 2081 may be formed at a lower height than the metal thin films 2093. For such an example, an upper surface of the resin 2081 may be concavely recessed toward the semiconductor light-emitting element to decrease the height, and a thickness of the adhesive layer (BL) may be increased at the relevant portion. Therefore, an adhesive force between the wavelength conversion layer (WL) and the color filter (CF) may be compensated. In this case, the resin 2081 may be a methyl-based Si-based resin, and the yellow phosphor may include at least one of YAG and LuAG. However, the present disclosure is not limited thereto, and for example, the second phosphor layer 2080b may be formed as a single layer including green phosphor.

On the contrary, the first phosphor layer 2080a includes a plurality of layers having at least a first layer 2083 and a second layer 2084. Either one of the first layer 2083 and the second layer 2084 may be realized by mixing red phosphor with a photosensitive material.

For example, in a method of using YAG to convert blue light into yellow light and then cutting red and green wavelengths with a color filter, a peak wavelength of YAG is within a range of 500 to 600 nm and a wavelength of greater than 600 nm is low in luminance, and there is a problem that luminance is lowered. At this time, when red phosphor is mixed with YAG, the luminance of green is reduced at a position implementing a green pixel since red phosphor absorbs light in the region of 500 to 600 nm. In this example, the YAG and the red phosphor are formed into a structure having a plurality of layers only at a position implementing a red pixel to solve these problems.

More specifically, on a first layer 2083 disposed on the lower side, first phosphor and a photosensitive material may be mixed together. The first phosphor may be red phosphor that is inorganic phosphor, and a size of the red phosphor may be less than 25% compared to the width of the phosphor layer. The photosensitive material may be acrylic, epoxy, silicone resin or the like as a material having a very high transmittance. Since the first layer 2083 has a structure in which red phosphor is mixed into the photosensitive material, the first layer 2083 may be selectively filled in a position implementing a red pixel through a photolithography process.

In addition, the height of the first layer 2083 may be greater than half the height of the partition wall portion 2090. In this case, the height of the first layer 2083 may be defined as the shortest distance from a lower surface to an upper surface of the first layer 2083. In other words, when the first layer has a concave shape, a distance between a bottom surface of the concave portion and a lower surface of the first layer may be the height.

Thus, a thickness of inorganic phosphor may be sufficiently secured through setting the height of the first layer 2083. For an example, the height of the first layer 2083 may be within a range of 50% to 90% of the height of the partition wall portion 2090.

The second layer 2084 is formed on the first layer 2083, and the second layer 2084 is formed of the same material as the second phosphor layer 2080b. In other words, the second layer 2084 has a structure in which yellow phosphor 2082 is mixed into the resin 2081. If the second phosphor layer 2080b is formed as a single layer having green phosphor, the second layer 2084 may be a layer having the green phosphor. As described above, in the present disclosure, phosphor included in a green pixel is partially filled into a red pixel through the entire coating.

More specifically, a plurality of semiconductor light-emitting elements is coupled to a substrate, and then the wavelength conversion layer is formed, and a color filter is disposed to cover the wavelength conversion layer using an adhesive layer. At this time, the first layer 2083 may be formed by a photolithography method, and the second layer 2084 may be formed by a coating method.

In the present example, yellow phosphor may be used for a green pixel, and yellow phosphor and red phosphor may be used for a red pixel, thereby allowing color coordinates adjustment using a phosphor suitable for each pixel. Moreover, in the present example, the selective filling of the red phosphor may exert the advantage of not limiting the use of the green phosphor.

In addition, shrinkage may occur due to the evaporation of solvent to cause a step between the color filter and the phosphor. However, red phosphor may be formed by photolithography, and then green or yellow phosphor may be filled into a region where the shrinkage occurs using a coating method such as screen printing or the like, thereby suppressing the step.

In the above, a structure capable of increasing red luminance through a new structure of the wavelength conversion layer (WL) has been described. On the other hand, not only inorganic phosphor but also organic phosphor may be used for the red phosphor. In this case, the red region may be patterned using organic red phosphor in a state where low shrinkage occurs by forming green or yellow phosphor using screen printing, thereby improving the step. Hereinafter, such a structure will be described in more detail.

Figure 16:
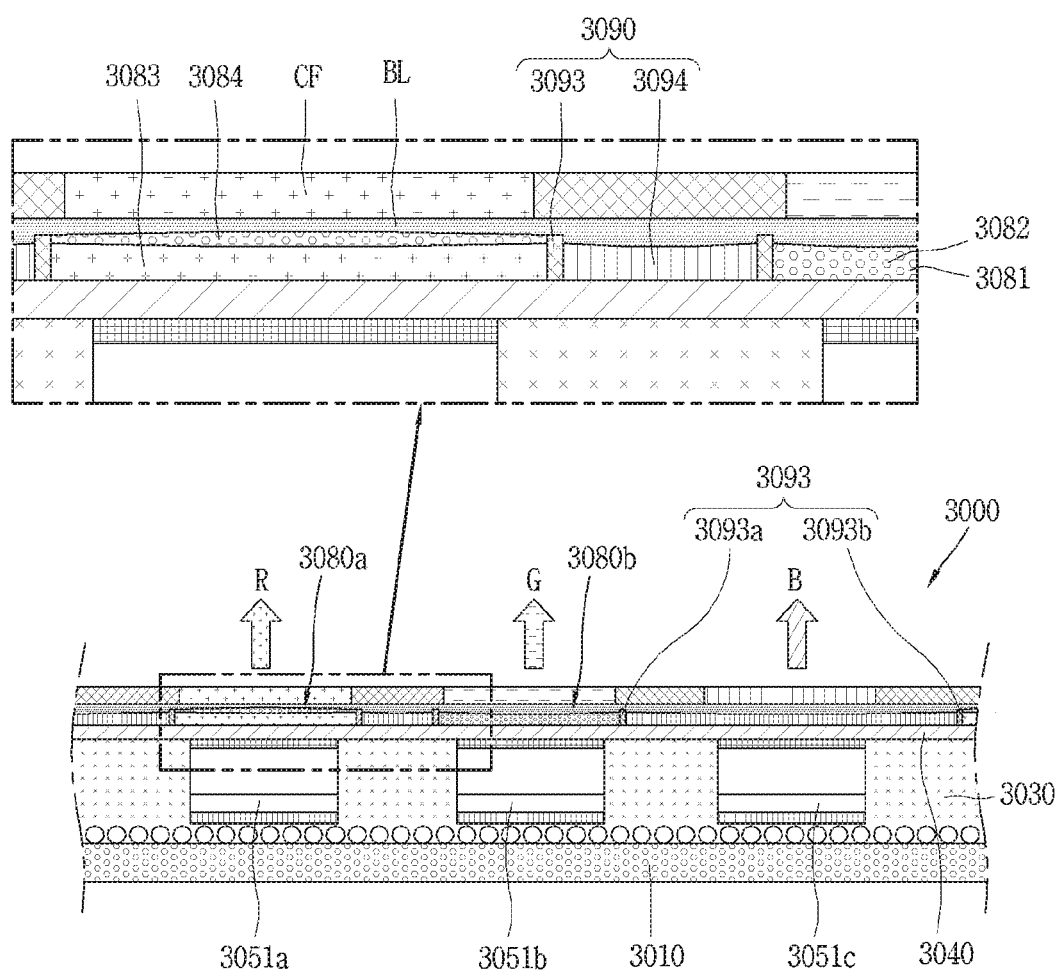
FIG. 16 is a cross-sectional view showing a modified example of a wavelength conversion layer in FIG. 13.
Figure 17:
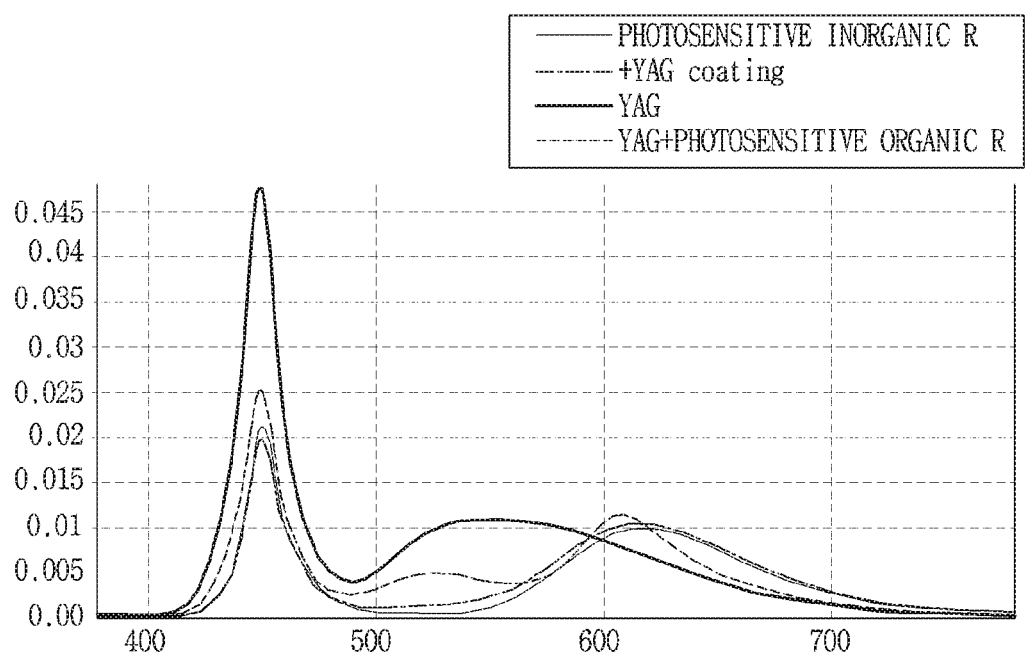
FIG. 17 is a graph showing measurement values obtained by measuring actual luminance using the structure of the present disclosure.

FIG. 16 is a cross-sectional view showing a modified example of a wavelength conversion layer in FIG. 13, and FIG. 17 is a graph showing measurement values obtained by measuring actual luminance using the structure of the present disclosure.

In the present example to be described below, the same or similar reference numerals are designated to the same or similar components as those of the example described above with reference to FIGS. 13 through 15, and the description thereof will be substituted by the earlier description. For example, the display device 3000 includes a substrate 3010, a first electrode 3020, a conductive adhesive layer 3030, a second electrode 3040, a plurality of semiconductor light-emitting elements 3050, and a color filter (CF), and the descriptions thereof will be substituted by the description with reference to FIGS. 13 through 15 as described above.

As shown in the foregoing embodiment, a display device 3000 includes a wavelength conversion layer (WL) disposed to cover a plurality of semiconductor light-emitting elements 3050, and the wavelength conversion layer (WL) includes a plurality of phosphor layers 3080 that convert a wavelength of light and a plurality of partition wall portions 3090 formed between the plurality of phosphor layers 3080.

The plurality of partition wall portions 3090 may have the same configuration as the partition wall portions of the foregoing example, and therefore, the description thereof will be substituted by the description with reference to FIGS. 13 through 15.

The plurality of phosphor layers 3080 may include a first phosphor layer 3080a disposed at a position corresponding to a red pixel and a second phosphor layer 3080b disposed at a position corresponding to a green pixel. In this case, the first phosphor layer 3080a and the second phosphor layer 3080b may be provided with a yellow phosphor capable of converting the blue light of the blue semiconductor light-emitting element 2051a, 2051b into yellow light or white light. Furthermore, the structure of the second phosphor layer 3080b may have the same structure as that of the second phosphor layer in the foregoing example, and therefore, the description thereof will be substituted by the description with reference to FIGS. 13 through 15.

Referring to FIG. 16, the first phosphor layer 3080a includes a plurality of layers having at least a first layer 3083 and a second layer 3084. Either one of the first layer 3083 and the second layer 3084 may be realized by mixing red phosphor with a photosensitive material. In this case, unlike the foregoing example, the first layer 3083 is disposed on the upper side and the second layer 3084 is disposed on the lower side.

For example, in the first layer 3083 disposed on the upper side, red phosphor which is organic phosphor may be mixed with a photosensitive material. At this time, a size of the phosphor may be less than 25% compared to the width of the phosphor layer. The photosensitive material may be acrylic, epoxy, silicone resin or the like as a material having a very high transmittance. In other words, red phosphor is provided as organic phosphor to form a first layer 3083, and a second layer 3084 having the yellow phosphor or green phosphor is formed below the first layer 3083.

In this case, the second layer 3084 may be formed of the same material and with the same height as the second phosphor layer 3080b disposed on the green pixel. In addition, the first layer 3083 is formed to protrude toward the color filter than the second phosphor layer 3080b, and configured with a small thickness. In other words, the first layer 3083 is located above the metal thin film of the partition wall portion. This is made possible by using red phosphor as organic phosphor. At this time, a thickness of the first layer 3083 may be set to less than 3 micrometers. For such an example, a thickness of the first layer 3083 may be within a range of 0.1 to 3 micrometers.

A graph illustrated in FIG. 17 is a measurement result obtained by applying the structure of the present disclosure, and it may be seen that luminance is increased when inorganic phosphor is used as shown in the foregoing example, and furthermore, also may be seen an effect when organic phosphor is used.

According to the graph, it may be seen that, in the case of using inorganic and organic red phosphors, the luminance of blue light (a band of about 450 nm) emitted through the phosphor is smaller than in the case of using only YAG as a yellow phosphor on a red pixel. Furthermore, it may be seen that luminance is increased in red (a band of about 630 nm) in the case of using the red phosphor than in the case of using only YAG.

Therefore, color purity may be improved in the display device of the present example. Moreover, it may be seen that brightness is improved in the case of using the red phosphor and the YAG together than in the case of using the red phosphor alone. In this case, it may be seen that red light having a short half width is realized when organic phosphor is used.

According to the foregoing structure, luminance and color gamut may be improved in a display device while maintaining the structural reliability of the color filter (CF) and the wavelength conversion layer (WL).

The configurations and methods according to the above-described embodiments will not be applicable in a limited way to the foregoing display device using a semiconductor light-emitting element, and all or part of each embodiment may be selectively combined and configured to make various modifications thereto.

What is claimed is:

1. A display device, comprising:
a substrate on which wiring electrodes are formed;
a plurality of semiconductor light-emitting elements electrically connected to the wiring electrodes;
a wavelength conversion layer provided with a plurality of phosphor layers that convert a wavelength of light and a plurality of partition wall portions formed between the plurality of phosphor layers to cover the plurality of semiconductor light-emitting elements; and
a color filter disposed to cover the wavelength conversion layer,
wherein the plurality of phosphor layers comprise:
a first phosphor layer disposed at a position corresponding to a red pixel and comprising a plurality of layers; and
a second phosphor layer disposed at a position corresponding to a green pixel and comprising a single layer, and
wherein the plurality of partition wall portions comprise:
a first partition wall portion disposed to cover a space between the plurality of semiconductor light-emitting elements; and
a second partition wall portion configured to cover a position corresponding to a blue pixel.

2. The display device of claim 1, wherein the plurality of layers are formed such that a red phosphor overlaps with a yellow or green phosphor.

3. The display device of claim 2, wherein a phosphor provided in the second phosphor layer is the yellow phosphor.

4. The display device according to claim 2, wherein the yellow phosphor comprises at least one of YAG or LuAG.

5. The display device according to claim 2, wherein the red phosphor is mixed with a photosensitive material to form any one of the plurality of layers.

6. The display device of claim 5, wherein the red phosphor forms a first layer comprising inorganic phosphor, and a height of the first layer is within a range of 50% to 90% of a height of the partition wall portions.

7. The display device of claim 6, wherein a second layer comprising the yellow phosphor is formed on the first layer.

8. The display device of claim 5, wherein the red phosphor forms a first layer comprising organic phosphor, and a second layer comprising the yellow phosphor is formed below the first layer.

9. The display device of claim 8, wherein the second layer is formed of a same material and with a same height as a phosphor layer disposed on the green pixel.

10. The display device of claim 9, wherein a thickness of the first layer is within a range of 0.1 to 3 micrometers.

11. A method of fabricating a display device, the method comprising:
coupling a plurality of semiconductor light-emitting elements to wiring electrodes formed on a substrate;
forming a wavelength conversion layer disposed to cover the plurality of semiconductor light-emitting elements, the wavelength conversion layer provided with a plurality of phosphor layers that convert a wavelength of light and a plurality of partition wall portions formed between the plurality of phosphor layers; and
placing a color filter to cover the wavelength conversion layer using an adhesive layer,
wherein the wavelength conversion layer comprises:
a first phosphor layer disposed at a position corresponding to a red pixel and comprising a plurality of layers; and
a second phosphor layer disposed at a position corresponding to a green pixel and comprising a single layer, and
wherein the plurality of partition wall portions comprise:
a first partition wall portion disposed to cover a space between the plurality of semiconductor light-emitting elements; and
a second partition wall portion configured to cover a position corresponding to a blue pixel.

12. The method of claim 11, wherein a first layer of the plurality of layers comprises a red phosphor formed by a photolithography method, and a second layer thereof comprises a yellow or green phosphor formed by a coating method.

13. The method of claim 12, wherein the first layer is formed by mixing the red phosphor with a photosensitive material.

\* \* \* \* \*